(12) United States Patent
Kim et al.

(10) Patent No.: US 11,349,457 B2
(45) Date of Patent: May 31, 2022

(54) SIGNAL GENERATION CIRCUIT HAVING MINIMUM DELAY, SEMICONDUCTOR APPARATUS USING THE SAME, AND SIGNAL GENERATION METHOD

(71) Applicant: SK hynix Inc., Icheon-si (KR)

(72) Inventors: Young Ouk Kim, Icheon-si (KR); Gyu Tae Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/170,417

(22) Filed: Feb. 8, 2021

(65) Prior Publication Data

US 2022/0094339 A1   Mar. 24, 2022

(30) Foreign Application Priority Data

Sep. 22, 2020   (KR) .................. 10-2020-0121949

(51) Int. Cl.
*H03K 3/017* (2006.01)
*H03L 7/081* (2006.01)
*H03K 5/01* (2006.01)
*H03K 5/00* (2006.01)

(52) U.S. Cl.
CPC .............. *H03K 3/017* (2013.01); *H03K 5/01* (2013.01); *H03L 7/0812* (2013.01); *H03K 2005/00019* (2013.01)

(58) Field of Classification Search
CPC ........... H03K 3/017; H03K 5/01; H03K 5/04; H03K 5/05; H03K 5/06; H03K 5/065; H03K 2005/00013; H03K 2005/00019; H03L 7/06; H03L 7/08; H03L 7/081; H03L 7/0812; H03L 7/0814; H03L 7/0816; H03L 7/0818

See application file for complete search history.

(56) References Cited

U.S. PATENT DOCUMENTS

| 8,237,479 B2 * | 8/2012 | Kao ..................... H03K 21/023 327/161 |
| 2010/0225372 A1 * | 9/2010 | Satoh .................... H03L 7/0805 327/175 |

FOREIGN PATENT DOCUMENTS

KR   1020140069978 A   6/2014

* cited by examiner

*Primary Examiner* — Diana J. Cheng
(74) *Attorney, Agent, or Firm* — William Park & Associates Ltd.

(57) ABSTRACT

A signal generation circuit includes a first delay circuit, a second delay circuit, and a duty control circuit. The first delay circuit delays a first input signal to generate a first output signal. The second delay circuit delays a second input signal to generate a second output signal. The duty control circuit compares phases of the first and second output signals and changes the value of the second delay control signal, and then decreases the times, by which the first and second input signals are delayed, by the same value.

27 Claims, 11 Drawing Sheets

SIGNAL GENERATION CIRCUIT HAVING MINIMUM DELAY, SEMICONDUCTOR APPARATUS USING THE SAME, AND SIGNAL GENERATION METHOD

CROSS-REFERENCES TO RELATED APPLICATION

The present application claims priority under 35 U.S.C. § 119(a) to Korean application number 10-2020-0121949, filed on Sep. 22, 2020, in the Korean Intellectual Property Office, which is incorporated herein by reference in its entirety.

BACKGROUND

1. Technical Field

Various embodiments generally relate to an integrated circuit technology, and more particularly, to a signal generation circuit and a semiconductor apparatus using the same.

2. Related Art

An electronic device may include numerous electronic components. Among the electronic components, a computer system may include many semiconductor apparatuses composed of semiconductors. The semiconductor apparatuses constituting the computer system may communicate with each other while transmitting and receiving a clock signal and data. The semiconductor apparatuses may generate internal clock signals having various phases by buffering or dividing a system clock signal. However, depending on circuit characteristics, a phase skew and/or duty ratio distortion may occur between the buffered clock signals or the divided clock signals. In general, the semiconductor apparatuses may include a duty correction circuit to correct such a phase skew and/or duty ratio distortion. A general duty correction circuit may set any one of a plurality of clock signals to a reference clock signal, and may adjust phase differences between the other clock signals and the reference clock signal, thereby compensating for the phase skew and/or duty ratio distortion.

SUMMARY

In an embodiment, a signal generation circuit may include a first delay circuit, a second delay circuit, and a duty control circuit. The first delay circuit may be configured to generate a first output signal by delaying a first input signal based on a first delay control signal. The second delay circuit may be configured to generate a second output signal by delaying a second input signal based on a second delay control signal. The duty control circuit may be configured to compare the phases of the first and second output signals and change the value of the second delay control signal. Then, the duty control circuit may decrease the values of the first and second delay control signals by a same value.

In an embodiment, a signal generation method may include generating a first output signal and a second output signal by delaying a first input signal and a second input signal by a first time, respectively. The signal generation method may include comparing the phases of the first and second output signals and changing the time by which the second input signal is delayed, to a second time. In addition, the signal generation method may include decreasing the first and second times by a same time.

In an embodiment, a signal generation circuit may include a first delay circuit, a second delay circuit, and a duty control circuit. The first delay circuit may be configured to generate a first output signal by delaying a first input signal, and the second delay circuit may be configured to generate a second output signal by delaying a second input signal. The duty control circuit may be configured to change a delay time of the second delay circuit until a phase difference between the first and second output signals reaches a target value. Then, the duty control circuit may decrease the delay times of the first and second delay circuits by a same time.

In an embodiment, a signal generation circuit may include four delay circuits and a duty control circuit. A first delay circuit may be configured to generate a first phase clock signal by delaying a first input clock signal by a reference delay time, and a second delay circuit may be configured to generate a second phase clock signal by delaying a second input clock signal by a first variable delay time. A third delay circuit may be configured to generate a third phase clock signal by delaying a third input clock signal by a second variable delay time, and a fourth delay circuit may be configured to generate a fourth phase clock signal by delaying a fourth input clock signal by a third variable delay time. The duty control circuit may be configured to change the first to third variable delay times based on phase differences among the first to fourth phase clock signals, and then may decrease the reference delay time and the first to third variable delay times by a same time.

DETAILED DESCRIPTION

Figure 1:
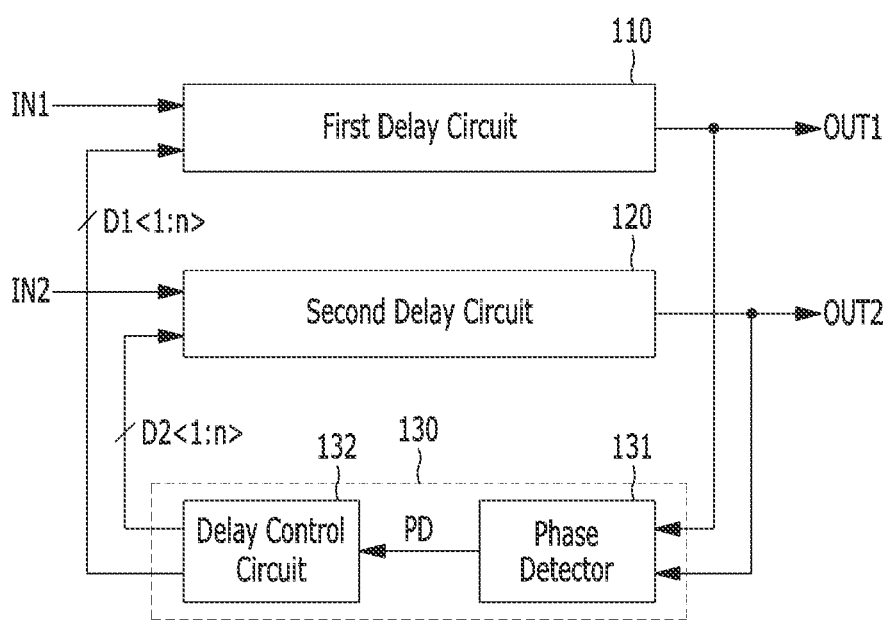
FIG. 1 is a block diagram illustrating a configuration of a signal generation circuit in accordance with an embodiment.

FIG. 1 is a block diagram illustrating a configuration of a signal generation circuit 100 in accordance with an embodiment. The signal generation circuit 100 may receive a first input signal IN1 and a second input signal IN2, and generate a first output signal OUT1 and a second output signal OUT2. The signal generation circuit 100 may generate the first output signal OUT1 by delaying the first input signal IN1, and generate the second output signal OUT2 by delaying the second input signal IN2. The signal generation circuit 100 may perform a phase and/or duty ratio correction operation on the first and second output signals OUT1 and OUT2. The signal generation circuit 100 may change the time by which the second input signal IN2 delayed, based on the phases of the first and second output signals OUT1 and OUT2. The signal generation circuit 100 may change the time by which the second input signal IN2 is delayed, and then reduce the times by which the first and second input signals IN1 and IN2 are delayed, by the same time. The signal generation circuit 100 may reduce the times, by which the first and second input signals IN1 and IN2 are delayed, by the shorter time between the times by which the first and second input signals IN1 and IN2 are delayed. Therefore, the delay time by which the signal generation circuit 100 delays the first and second input signals IN1 and IN2 may be set to a minimum value.

The signal generation circuit 100 may include a first delay circuit 110, a second delay circuit 120 and a duty control circuit 130. The first delay circuit 110 may receive the first input signal IN1, and generate the first output signal OUT1 by delaying the first input signal IN1. The second delay circuit 120 may receive the second input signal IN2, and generate the second output signal OUT2 by delaying the second input signal IN2. The first and second delay circuits 110 and 120 may be variable delay circuits, wherein the first delay circuit 110 may receive a first delay control signal D1<1:n>, and may have a delay time that is changed according to the first delay control signal D1<1:n>. Here, n may be an integer equal to or more than 2. The second delay circuit 120 may receive a second delay control signal D2<1:n>, and may have a delay time that is changed according to the second delay control signal D2<1:n>. The first and second delay circuits 110 and 120 may be digital delay circuits. The first and second delay control signals D1<1:n> and D2<1:n> may be digital signals, each including a plurality of bits. In an embodiment, the first and second delay circuits 110 and 120 may be analog delay circuits. The first and second delay control signals D1<1:n> and D2<1:n> may be analog signals having various voltage levels. The following descriptions will be based on the supposition that the first and second delay control signals D1<1:n> and D2<1:n> are digital signals, and the first and second delay circuits 110 and 120 are digital delay lines whose delay amounts are adjusted based on the first and second delay control signals D1<1:n> and D2<1:n>, respectively.

The duty control circuit 130 may receive the first and second output signals OUT1 and OUT2. The duty control circuit 130 may compare the phases of the first and second output signals OUT1 and OUT2. The duty control circuit 130 may compare the phases of the first and second output signals OUT1 and OUT2, and may change the delay times of the first and second delay circuits 110 and 120. In order to change the delay times of the first and second delay circuits 110 and 120, the duty control circuit 130 may compare the phases of the first and second output signals OUT1 and OUT2, and may change the logic values of the first and second delay control signals D1<1:n> and D2<1:n>. The duty control circuit 130 may change the value of the second delay control signal D2<1:n> until a phase difference between the first and second output signals OUT1 and OUT2 reaches a target value, which may be randomly set. For example, when the first and second input signals IN1 and IN2 are clock signals, the target value may correspond to ¼ period of the first or second input signal IN1 or IN2. After changing the value of the second delay control signal D2<1:n>, the duty control circuit 130 may decrease the values of the first and second delay control signals D1<1:n> and D2<1:n> by the same value. In an embodiment, the duty control circuit 130 may decrease the logic values of the first and second delay control signals D1<1:n> and D2<1:n> by the logic value of the delay control signal having the smaller value between the first and second delay control signals D1<1:n> and D2<1:n>. That is, the logic values of the first and second delay control signals D1<1:n> and D2<1:n> may be compared, and the smaller logic value of the first and second delay control signals D1<1:n> and D2<1:n> may be used to decrease each of the logic values of the first and second delay control signals D1<1:n> and D2<1:n>. The duty control circuit 130 may sequentially decrease the logic values of the first and second delay control signals D1<1:n> and D2<1:n> until the logic value of any one of the first and second delay control signals D1<1:n> and D2<1:n> is minimized.

In the initial state, the first and second delay control signals D1<1:n> and D2<1:n> may each have a default value. Thus, the first and second delay circuits 110 and 120 may delay the first and second delay control signals D1<1:n> and D2<1:n> having the default value by a reference delay time. The duty control circuit 130 may increase or decease the logic value of the second delay control signal D2<1:n> when a phase difference between the first and second output signals OUT1 and OUT2 is larger or smaller than the target value. The second delay circuit 120 may change the delay time by which the second input signal IN2 is delayed, based on the second delay control signal D2<1:n> having an increased or decreased logic value. When the phase difference between the first and second output signals OUT1 AND OUT2 corresponds to the target value, the duty control circuit 130 may decrease the logic values of the first and second delay control signals D1<1:n> and D2<1:n> by the same value. The delay times of the first and second delay circuits 110 and 120 may be decreased by the same time. The duty control circuit 130 may adjust the duty ratios of the first and second output signals OUT1 and OUT2 by controlling the first and second output signals OUT1 and OUT2 to have a phase difference corresponding to the target value. Since the delay times of the first and second delay circuits 110 and 120 for adjusting the duty ratio may be set to the minimum value, the operation characteristic and speed of the signal generation circuit 100 may be improved.

The duty control circuit 130 may include a phase detector 131 and a delay control circuit 132. The phase detector 131 may receive the first and second output signals OUT1 and OUT2. The phase detector 131 may also generate a phase detection signal PD by comparing the phases of the first and second output signals OUT1 and OUT2. The phase detector 131 may adopt the configuration of any publicly known phase detector and/or duty detector and, depending on whether a phase difference between the first and second output signals OUT1 and OUT2 is larger or smaller than the target value, may generate the phase detection signal PD having a different logic level. For example, the phase detection signal PD having a first logic level may increase the logic value of the second delay control signal D2<1:n> generated by the duty control circuit 130, thereby increasing the delay time of the second delay circuit 120. The phase detection signal PD having a second logic level may decrease the logic value of the second delay control signal D2<1:n> generated by the duty control circuit 130, thereby decreasing the delay time of the second delay circuit 120.

The delay control circuit 132 may generate the first and second delay control signals D1<1:n> and D2<1:n> based on the phase detection signal PD. The delay control circuit 132 may output the first and second delay control signals D1<1:n> and D2<1:n> having the default value in the initial state. The first and second delay circuits 110 and 120 may delay the first and second input signals IN1 and IN2 by the reference delay time, respectively, based on the first and second delay control signals D1<1:n> and D2<1:n> having the default value. Based on the phase detection signal PD, the delay control circuit 132 may change the logic value of the second delay control signal D2<1:n> until the phase difference between the first and second output signals OUT1 and OUT2 corresponds to the target value. The delay control circuit 132 may decrease the logic values of the first and second delay control signals D1<1:n> and D2<1:n> by the same value, after the phase difference between the first and second output signals OUT1 and OUT2 corresponds to the target value.

Figure 2:
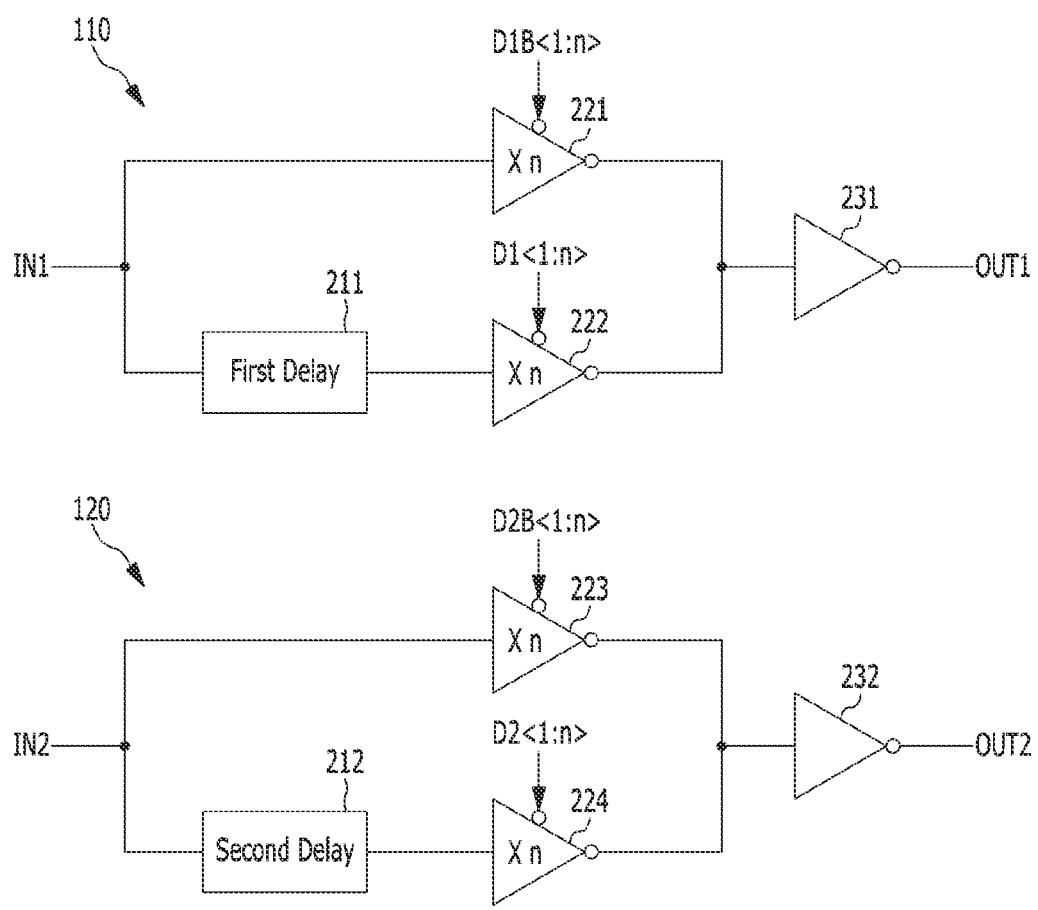
FIG. 2 is a diagram illustrating configurations of first and second delay circuits illustrated in FIG. 1.

FIG. 2 is a diagram illustrating configurations of the first and second delay circuits 110 and 120 illustrated in FIG. 1. Referring to FIG. 2, the first delay circuit 110 may include a first delay 211, a first driver group 221, a second driver group 222 and a first output inverter 231. The first delay 211 may have a delay amount corresponding to the maximum delay time that the first delay circuit 110 may have. Based on the first delay control signal D1<1:n>, the first delay circuit 110 may change weights of the first and second driver groups 221 and 222, and thus change the time by which the first input signal IN1 is delayed. Each of the first and second driver groups 221 and 222 may receive the first delay control signal D1<1:n>.

The first driver group 221 may receive the first input signal IN1. Based on the first delay control signal D1<1:n>, the first driver group 221 may invert the first input signal IN1 with variable drivability. The drivability of the first driver group 221 may be changed based on an inverted signal D1B<1:n> of the first delay control signal. The first driver group 221 may include a plurality of inverters corresponding to the respective bits of the first delay control signal D1<1:n>. That is, the first driver group 221 may include n inverters, wherein the inverters may each receive one bit of the first delay control signal D1<1:n>. For example, as the number of bits having a low logic level among the bits of the first delay control signal D1<1:n> increases, the drivability of the first driver group 221 may be increased, and the delay time of the first delay circuit 110 may be shortened.

The second driver group 222 may receive an output of the first delay 211. Based on the first delay control signal D1<1:n>, the second driver group 222 may invert an output of the first delay 211 with variable drivability. The drivability of the second driver group 222 may be changed based on the first delay control signal D1<1:n>. The second driver group 222 may include a plurality of inverters corresponding to the respective bits of the first delay control signal D1<1:n>. The inverters may each receive one bit of the first delay control signal D1<1:n>. For example, as the number of bits having a high logic level among the bits of the first delay control signal D1<1:n> increases, the drivability of the second driver group 222 may be increased. Hence, the delay time of the first delay circuit 110 may be lengthened.

The first output inverter 231 may be coupled to the first and second driver groups 221 and 222 in common, and may receive outputs of the first and second driver groups 221 and 222. The first output inverter 231 may generate the first output signal OUT1 by inverting the outputs of the first and second driver groups 221 and 222. By mixing the phases of the outputs of the first and second driver groups 221 and 222, which are generated according to a weight decided based on the first delay control signal D, the first output inverter 231 may generate the first output signal OUT1 1<1:n>.

The second delay circuit 120 may include a second delay 212, a third driver group 223, a fourth driver group 224 and a second output inverter 232. The second delay 212 may have a delay amount corresponding to the maximum delay time that the second delay circuit 120 may have. The delay amount of the second delay 212 may be substantially equal to the delay amount of the first delay 211. Based on the second delay control signal D2<1:n>, the second delay circuit 120 may change weights of the third and fourth driver groups 223 and 224, and thus change the time by which the second input signal IN2 is delayed. Each of the third and fourth driver groups 223 and 224 may receive the second delay control signal D2<1:n>.

The third driver group 223 may receive the second input signal IN2. Based on the second delay control signal D2<1:n>, the third driver group 223 may invert the second input signal IN2 with variable drivability. The drivability of the third driver group 223 may be changed based on an inverted signal D2B<1:n> of the second delay control signal. The third driver group 223 may include a plurality of inverters corresponding to the respective bits of the second delay control signal D2<1:n>, wherein the inverters may each receive one bit of the second delay control signal D2<1:n>. For example, as the number of bits having a low logic level among the bits of the second delay control signal D2<1:n> increases, the drivability of the third driver group 223 may be increased, so that the delay time of the second delay circuit 120 may be shortened.

The fourth driver group 224 may receive an output of the second delay 212. Based on the second delay control signal D2<1:n>, the fourth driver group 224 may invert an output of the second delay 212 with variable drivability. Based on the second delay control signal D2<1:n>, the drivability of the fourth driver group 224 may be changed. The fourth driver group 224 may include a plurality of inverters corresponding to the respective bits of the 25 second delay control signal D2<1:n>, wherein the inverters may each receive one bit of the second delay control signal D2<1:n>. For example, as the number of bits having a high logic level among the bits of the second delay control signal D2<1:n> increases, the drivability of the fourth driver group 224 may be increased. Hence, the delay time of the second delay circuit 120 may be lengthened.

The second output inverter 232 may be coupled to the third and fourth driver groups 223 and 224 in common, and may receive outputs of the third and fourth driver groups 223 and 224. By inverting the outputs of the third and fourth driver groups 223 and 224, the second output inverter 232 may generate the second output signal OUT2. The second output inverter 232 may generate the second output signal OUT2 by mixing the phases of the outputs of the third and fourth driver groups 223 and 224, which are generated according to a weight decided based on the logic value of the second delay control signal D2<1:n>.

Figure 3:
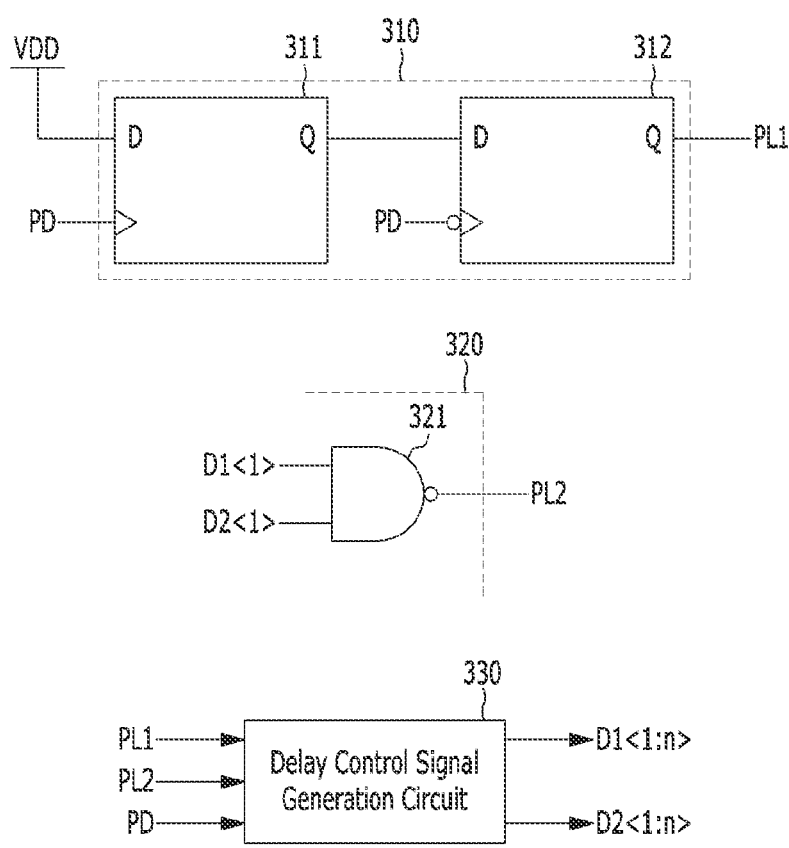
FIG. 3 is a block diagram illustrating a configuration of a delay control circuit illustrated in FIG. 1.

FIG. 3 is a block diagram illustrating a configuration of the delay control circuit 132 illustrated in FIG. 1. Referring to FIG. 3, the delay control circuit 132 may include a first phase locking detector 310, a second phase locking detector 320 and a delay control signal generation circuit 330. Based on the phase detection signal PD, the first phase locking detector 310 may generate a first phase locking signal PL1. The first phase locking detector 310 may detect a change in logic level of the phase detection signal PD, and may enable the first phase locking signal PL1. When a previously received phase detection signal PD is at a first logic level and a currently received phase detection signal PD is at a second logic level, the first phase locking detector 310 may enable the first phase locking signal PL1. For example, the phase detection signal PD having the first logic level may increase the logic value of the second delay control signal D2<1:n>, and increase the delay time of the second delay circuit 120. The phase detection signal PD having the second logic level may decrease the logic value of the second delay control signal D2<1:n>, and may decrease the delay time of the second delay circuit 120.

The first phase locking detector 310 may include a first flip-flop 311 and a second flip-flop 312, wherein the first flip-flop 311 may have an input terminal D configured to receive a supply voltage VDD and a clock terminal configured to receive the phase detection signal PD. The supply voltage VDD may have a voltage level which may be determined as a high logic level. The second flip-flop 312 may have an input terminal D coupled to an output terminal Q of the first flip-flop 311, and may be configured to receive a signal outputted from the first flip-flop 311. The second flip-flop 312 may have a clock terminal configured to receive an inverted signal of the phase detection signal PD, and an output terminal Q configured to output the first phase locking signal PL1. When the previously received phase detection signal PD has a high logic level and the currently received phase detection signal PD has a low logic level, the first and second flip-flops 311 and 312 may output the supply voltage VDD as the first phase locking signal PL1 to enable the first phase locking signal PL1 to a high logic level.

Based on the first delay control signal D1<1:n> and the second delay control signal D2<1:n>, the second phase locking detector 320 may generate a second phase locking signal PL2. Based on at least some bits of the first and second delay control signals D1<1:n> and D2<1:n>, the second phase locking detector 320 may generate the second phase locking signal PL2. For example, the second phase locking detector 320 may receive the least significant bits of the first and second delay control signals D1<1:n> and D2<1:n>, and detect the logic levels of the least significant bits and enable the second phase locking signal PL2. When any one of the least significant bits of the first and second delay control signals D1<1:n> and D2<1:n> becomes a low logic level, the second phase locking detector 320 may enable the second phase locking signal PL2. The first delay circuit 110 may have a short delay time as the number of bits having a low logic level among the bits of the first delay control signal D1<1:n> increases. Thus, when the least significant bit of the first delay control signal D1<1:n> has a low logic level, the first delay control signal D1<1:n> may have a minimum value, and the second phase locking detector 320 may detect that the delay time of the first delay circuit 110 is set to a minimum value. Similarly, as the number of bits having a low logic level among the bits of the second delay control signal D2<1:n> increases, the second delay circuit 120 may have a short delay time. Thus, when the least significant bit of the second delay control signal D2<1:n> has a logic low level, the second delay control signal D2<1:n> may have a minimum value, and the second phase locking detector 320 may detect that the delay time of the second delay circuit 120 is set to a minimum value. Therefore, when any one of the first and second delay circuits 110 and 120 has a minimum delay time, the second phase locking detector 320 may enable the second phase locking signal PL2.

The second phase locking detector 320 may include a NAND gate 321, wherein the NAND gate 321 may receive the least significant bits of the first and second delay control signals D1<1:n> and D2<1:n>, and output the second phase locking signal PL2. When any one of the least significant bits of the first and second delay control signals D1<1:n> and D2<1:n> transitions to a low logic level, the NAND gate 321 may enable the second phase locking signal PL2 to a high logic level.

The delay control signal generation circuit 330 may receive the phase detection signal PD, the first phase locking signal PL1 and the second phase locking signal PL2, and may generate the first delay control signal D1<1:n> and the second delay control signal D2<1:n>. The delay control signal generation circuit 330 may output the first and second delay control signals D1<1:n> and D2<1:n> having the default value in the initial state. The default value may be stored in the delay control signal generation circuit 330, and the delay control signal generation circuit 330 may change the logic value of the second delay control signal D2<1:n> based on the phase detection signal PD, until the first phase locking signal PL1 is enabled. For example, when the phase detection signal PD is at a high logic level, the delay control signal generating circuit 330 may increase the logic value of the second delay control signal D2<1:n>. When the phase detection signal PD is at a low logic level, the delay control signal generation circuit 330 may decrease the logic value of the second delay control signal D2<1:n>. When the first phase locking signal PL1 is enabled, the delay control signal generating circuit 330 may change the logic values of the first and second delay control signals D1<1:n> and D2<1:n>. For example, the delay control signal generation circuit 330 may sequentially decrease the logic values of the first and second delay control signals D1<1:n> and D2<1:n> such that the logic values are increased or decreased like a thermometer code. For example, the delay control signal generating circuit 330 may sequentially change the logic values of the first and second delay control signals D1<1:n> and D2<1:n> to a low logic level from the most significant bits having a high logic level, thereby sequentially decreasing the logic values of the first and second delay control signals D1<1:n> and D2<1:n>. Until the second phase locking signal PL2 is enabled, the delay control signal generation circuit 330 may decrease the logic values of the first and second delay control signals D1<1:n> and D2<1:n>. When the second phase locking signal PL2 is enabled, the delay control signal generation circuit 330 may retain the logic values of the first and second delay control signals D1<1:n> and D2<1:n>. For example, when the first and second delay control signals D1<1:n> and D2<1:n> are 4-bit signals, the first delay control signal D1<1:n> has a logic value of 0011, and the second delay control signal D2<1:n> has a logic value of 0111. The delay control signal generation circuit 330 may first change the third bit of the first delay control signal D1<1:n> and the second bit of the second delay control signal D2<1:n> to a low logic level. Therefore, the first delay control signal D1<1:n> may have a logic value of 0001, and the second delay control signal D2<1:n> may have a logic value of 0011. Then, the delay control signal generation circuit 330 may change the least significant bit of the first delay control signal D1<1:n> and the third bit of the second delay control signal D2<1:n> to a low logic level so that the first delay control signal D1<1:n> may have a logic value of 0000, and the second delay control signal D2<1:n> may have a logic value of 0001. When the least significant bit of the first delay control signal D1<1:n> transitions to a low logic level, the second phase locking signal PL2 may be enabled, and the delay control signal generation circuit 330 may not decrease the logic values of the first and second delay control signals D1<1:n> and D2<1:n> any more. Thus, the first delay control signal D1<1:n> may be set to 0000, and the second delay control signal D2<1:n> may be set to 0001. The delay control signal generation circuit 330 may include any logic circuit configured to perform the above-described operation.

Figure 4:
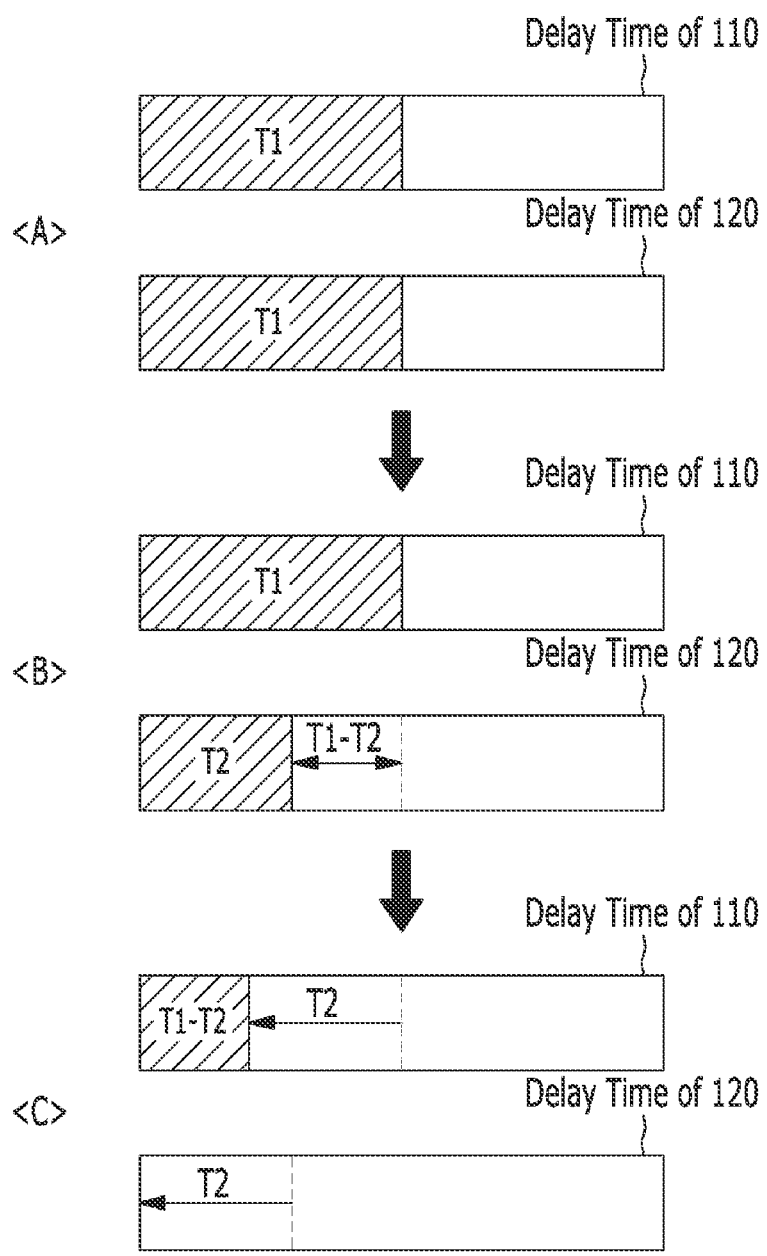
FIG. 4 is a block diagram illustrating an operation of the signal generation circuit in accordance with the present embodiment.

FIG. 4 is a block diagram illustrating an operation of the signal generation circuit in accordance with the present embodiment. In FIG. 4, bar graphs indicate a delay time of the first delay circuit 110, which is set based on the first delay control signal D1<1:n>, and a delay time of the second delay circuit 120, which is set based on the second delay control signal D2<1:n>. Referring to FIGS. 1 to 4, the operation of the signal generation circuit 100 in accordance with the embodiment will be described as follows. In the initial state as illustrated by <A>, the delay control signal generation circuit 330 may output the first and second delay control signals D1<1:n> and D2<1:n> having a default value, and the delay times of the first and second delay circuits 110 and 120 may be set to the reference delay time, which may be a first time T1. The phase detector 131 may detect the phases of the first and second output signals OUT1 and OUT2, and may generate the phase detection signal PD. For example, when a phase difference between the first and second output signals OUT1 and OUT2 is larger than the target value, the phase detector 131 may generate the phase detection signal PD having a low logic level, and, based on the phase detection signal PD, the delay control signal generation circuit 330 may decrease the logic value of the second delay control signal D2<1:n>. When the delay time of the second delay circuit 120 is continuously decreased according to the logic value of the second delay control signal D2<1:n>, the phase difference between the first and second output signals OUT1 and OUT2 may approach the target value. When the phase difference between the first and second output signals OUT1 and OUT2 becomes smaller than the target value around the target value, the phase detector 131 may generate the phase detection signal PD having a logic high level. The delay control signal generation circuit 330 may increase the logic value of the second delay control signal D2<1:n>, and the phase difference between the first and second output signals OUT1 and OUT2 may become larger than the target value around the target value. The phase detector 131 may generate the phase detection signal PD having a low logic level, and the first phase locking detector 310 may detect that the phase detection signal PD transitions from a high logic level to a low logic level, and enable the first phase locking signal PL1. As illustrated in <B>, the delay time of the second delay circuit 120 may be set to a variable delay time shorter than the first time T1, and the variable delay time may be a second time T2. Therefore, a difference between the delay time of the first delay circuit 110 and the delay time of the second delay circuit 120 may correspond to a time T1-T2 obtained by subtracting the second time from the first time. When the first phase locking signal PL1 is enabled, the delay control signal generation circuit 330 may sequentially decrease the logic values of the first and second delay control signals D1<1:n> and D2<1:n>. Since the second time T2 is shorter between the first and second times T1 and T2, the delay control signal generation circuit 330 may decrease the logic values of the first and second delay control signals D1<1:n> and D2<1:n> by a logic value corresponding to the second delay control signal D2<1:n>. That is, the delay control signal generation circuit 330 may change the bits of the first and second delay control signals D1<1:n> and D2<1:n>, which have a high logic level, to a low logic level by the number of bits having a high logic level in the second delay control signal D2<1:n>. When the logic value of the second delay control signal D2<1:n> is minimized, the second phase locking detector 320 may enable the second phase locking signal PL2. When the second phase locking signal PL2 is enabled, the delay time of the first delay circuit 110 may be set to the time T1-T2 obtained by subtracting the second time from the first time, as indicated by <C>, and the delay time of the second delay circuit 120 may be set to substantially 0. Therefore, the signal generation circuit 100 may generate the first and second output signals OUT1 and OUT2 by delaying the first and second input signals IN1 and IN2 by a minimum time. The signal generation circuit 100 may minimize the delay time required for generating the first and second output signals OUT1 and OUT2, while adjusting the duty ratios of the first and second output signals OUT1 and OUT2.

Figure 5:
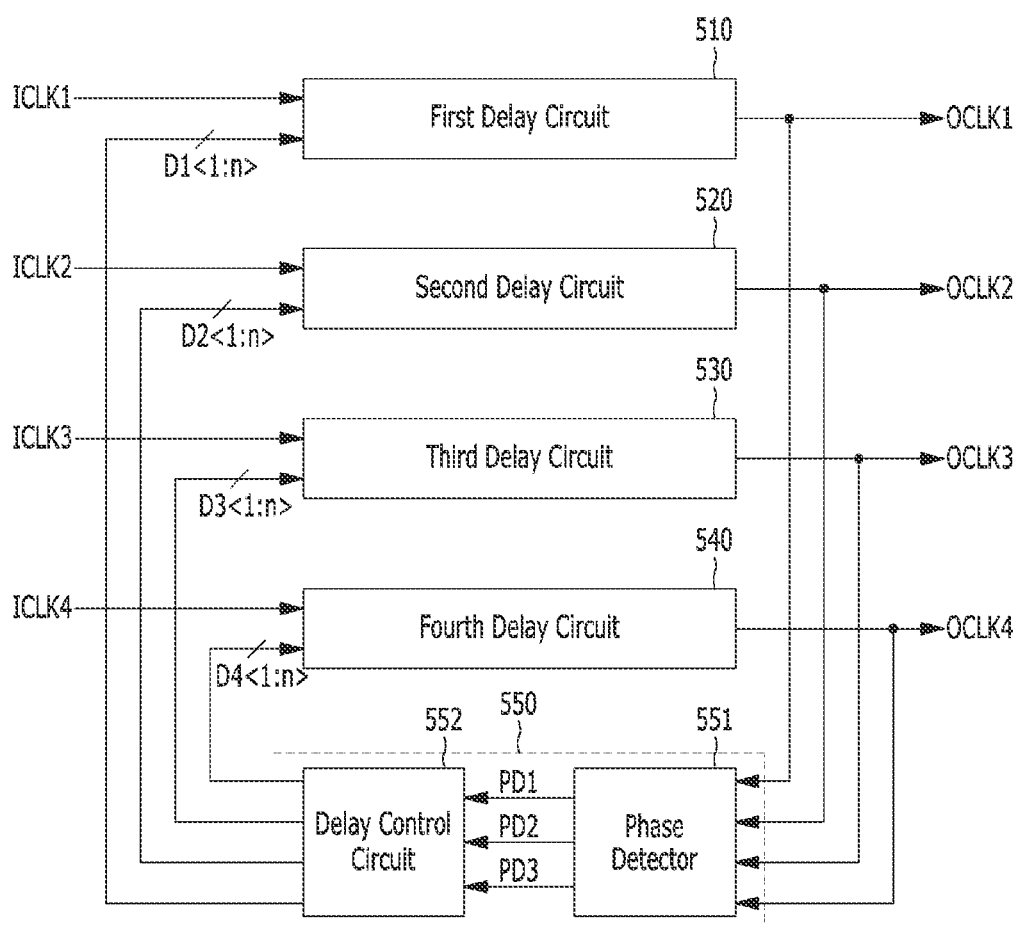
FIG. 5 is a block diagram illustrating a configuration of a signal generation circuit in accordance with an embodiment.

FIG. 5 is a block diagram illustrating a configuration of a signal generation circuit 500 in accordance with an embodiment. While the signal generation circuit 100 illustrated in FIG. 1 is configured to adjust the duty ratios and/or phases of two output signals which are generated based on two input signals, the signal generation circuit 500 illustrated in FIG. 5 may be configured to adjust the duty ratios and/or phases of four output signals which are generated based on four input signals. The number of signals inputted to the signal generation circuit or outputted from the signal generation circuit is not limited to 2 or 4, but may be set to 3 or 5 or more. Referring to FIG. 5, the signal generation circuit 500 may include a first delay circuit 510, a second delay circuit 520, a third delay circuit 530, a fourth delay circuit 540 and a duty control circuit 550. The first delay circuit 510 may receive a first input clock signal ICLK1, and generate, by variably delaying the first input clock signal ICLK1, a first phase clock signal OCLK1. The first delay circuit 510 may generate the first phase clock signal OCLK1 by variably delaying the first input clock signal ICLK1 based on a first delay control signal D1<1:n>. By delaying the first input clock signal ICLK1 by a first variable delay time, the first delay circuit 510 may generate the first phase clock signal OCLK1. In the initial state, the first delay control signal D1<1:n> may have a default value, and the first variable delay time may be set to a reference delay time based on the first delay control signal D1<1:n> having the default value. By variably delaying the second input clock signal ICLK2, the second delay circuit 520 may receive a second input clock signal ICLK2, and generate a second phase clock signal OCLK2. Based on a second delay control signal D2<1:n>, the second delay circuit 520 may generate the second phase clock signal OCLK2 by variably delaying the second input clock signal ICLK2. The second delay circuit 520 may generate the second phase clock signal OCLK2 by delaying the second input clock signal ICLK2 by a second variable delay time. In the initial state, the second delay control signal D2<1:n> may have the default value, and the second variable delay time may be set to the reference delay time based on the second delay control signal D2<1:n> having the default value. By variably delaying the third input clock signal ICLK3, the third delay circuit 530 may receive a third input clock signal ICLK3, and generate a third phase clock signal OCLK3. Based on a third delay control signal D3<1:n>, the third delay circuit 530 may generate the third phase clock signal OCLK3 by variably delaying the third input clock signal ICLK3. The third delay circuit 530 may generate the third phase clock signal OCLK3 by delaying the third input clock signal ICLK3 by a third variable delay time. In the initial state, the third delay control signal D3<1:n> may have the default value, and, based on the third delay control signal D3<1:n> having the default value, the third variable delay time may be set to the reference delay time. The fourth delay circuit 540 may receive a fourth input clock signal ICLK4, and generate a fourth phase clock signal OCLK4 by variably delaying the fourth input clock signal ICLK4. By variably delaying the fourth input clock signal ICLK4 based on a fourth delay control signal D4<1:n>, the fourth delay circuit 540 may generate the fourth phase clock signal OCLK4. By delaying the fourth input clock signal ICLK4 by a fourth variable delay time, the fourth delay circuit 540 may generate the fourth phase clock signal OCLK4. In the initial state, the fourth delay control signal D4<1:n> may have the default value, and the fourth variable delay time may be set to the reference delay time based on the fourth delay control signal D4<1:n> having the default value.

The first to fourth input clock signals ICLK1 to ICLK4 may sequentially have a phase difference of 90 degrees therebeween. Thus, the first input clock signal ICLK1 may lead the second input clock signal ICLK2 by 90 degrees, the second input clock signal ICLK2 may lead the third input clock signal ICLK3 by 90 degrees, the third input clock signal ICLK3 may lead the fourth input clock signal ICLK4 by 90 degrees, and the fourth input clock signal ICLK4 may lead the first input clock signal ICLK1 by 90 degrees. Ideally, when the delay times of the first to fourth delay circuits 510, 520, 530 and 540 are equal to the reference delay time, the first to fourth phase clock signals OCLK1 to OCLK4 may sequentially have a phase difference of 90 degrees. However, the delay times of the first to fourth delay circuits 510, 520, 530 and 540 may be changed by characteristic and process variations of the first to fourth delay circuits 510, 520, 530 and 540 or characteristic and process variations of other circuits which generate or transmit the first to fourth input clock signals ICLK1 to ICLK4. Also, the phase differences and duty ratios of the first to fourth phase clock signals OCLK1 to OCLK4 outputted from the first to fourth delay circuits 510, 520, 530 and 540 may be changed. The duty control circuit 550 may detect the phases of the first to fourth phase clock signals OCLK1 to OCLK4, and, by individually controlling the first to fourth variable delay times, may compensate for changes in phase and/or duty ratio. The first to fourth delay circuits 510, 520, 530 and 540 may have the same structure as one of the first and second delay circuits 110 and 120 illustrated in FIG. 2, except for input signals and output signals.

The duty control circuit 550 may detect the phases of the first to fourth phase clock signals OCLK1 to OCLK4, and may generate the first to fourth delay control signals D1<1:n> to D4<1:n>. The duty control circuit 550 may individually adjust the second to fourth variable delay times according to the results obtained by detecting the phases of the first to fourth phase clock signals OCLK1 to OCLK4. The first variable delay time may be retained as the reference delay time. After adjusting the second to fourth variable delay times, the duty control circuit 550 may decrease the first to fourth variable delay times by the same time. For example, the duty control circuit 550 may decrease the first to fourth variable delay times by the shortest time among the first to fourth variable delay times. The duty control circuit 550 may detect the phases of the first to fourth phase clock signals OCLK1 to OCLK4, and individually change the logic values of the second to fourth delay control signals D2<1:n> to D4<1:n>, while the first delay control signal D1<1:n> may retain the default value. The duty control circuit 550 may change the logic values of the second to fourth delay control signals D2<1:n> to D4<1:n>, Then, the duty control circuit 550 may decrease the logic values of the first to fourth delay control signals D1<1:n> to D4<1:n> by the same value. For example, the duty control circuit 550 may decrease the logic values of the first to fourth delay control signals D1<1:n> to D4<1:n> by the logic value of the delay control signal having the smallest logic value among the first to fourth delay control signals D1<1:n> to D4<1:n>.

The duty control circuit 550 may include a phase detector 551 and a delay control circuit 552, wherein the phase detector 551 may detect the phases of the first to fourth phase clock signals OCLK1 and OCLK4, and may generate a first phase detection signal PD1, a second phase detection signal PD2 and a third phase detection signal PD3. The phase detector 551 may include any publicly known phase detector or duty detector capable of detecting phase differences among four input signals. For example, the phase detector 551 may detect whether a phase difference between the first and second phase clock signals OCLK1 and OCLK2 corresponds to a first target value. Then, the phase detector 551 may generate the first phase detection signal PD1. The first target value may correspond to ¼ period of the first input clock signal ICKL1. The phase detector 551 may detect whether a phase difference between the first and third phase clock signals OCLK1 and OCLK3 corresponds to a second target value, which may correspond to ½ period of the first input clock signal ICKL1, and may generate the second phase detection signal PD2. The phase detector 551 may detect whether a phase difference between the first and fourth phase clock signals OCLK1 and OCLK4 corresponds to a third target value, which may correspond to ¾ period of the first input clock signal ICKL1, and may generate the third phase detection signal PD3. So far, the function and operation of the phase detector 551 have been described. However, the present embodiment is not limited thereto, and various phase detectors which function and operate in different manners may be applied as the phase detector 551.

The delay control circuit 552 may generate the first to fourth delay control signals D1<1:n> to D4<1:n> having the default value in the initial state. By changing the logic value of the second delay control signal D2<1:n> based on the first phase detection signal PD1, the delay control circuit 552 may change the second variable delay time. By changing the logic value of the third delay control signal D3<1:n> based on the second phase detection signal PD2, the delay control circuit 552 may change the third variable delay time. By changing the logic value of the fourth delay control signal D4<1:n> based on the third phase detection signal PD3, the delay control circuit 552 may change the fourth variable delay time. After changing the second to fourth variable delay times by changing the logic values of the second to fourth delay control signals D2<1:n> to D4<1:n>, the delay control circuit 552 may decrease the logic values of the first to fourth delay control signals D1<1:n> to D4<1:n> by the same value, thereby decreasing the first to fourth variable delay times by the same time.

Figure 6:
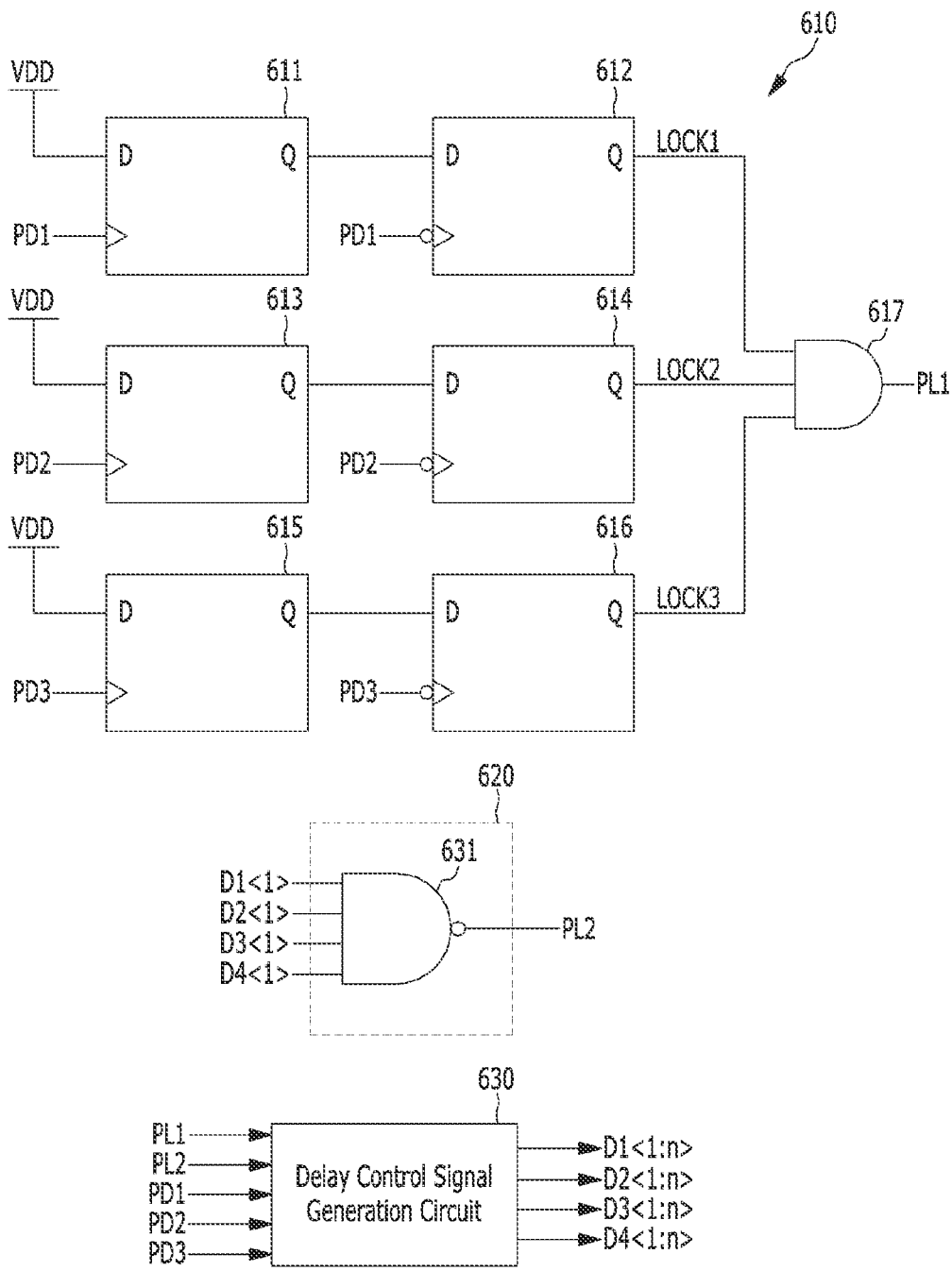
FIG. 6 is a block diagram illustrating a configuration of a delay control circuit illustrated in FIG. 5.

FIG. 6 is a block diagram illustrating a configuration of the delay control circuit 552 illustrated in FIG. 5. Referring to FIG. 6, the delay control circuit 552 may include a first phase locking detector 610, a second phase locking detector 620 and a second delay control signal generation circuit 630. The first phase locking detector 610 may receive the first to third phase detection signals PD1 to PD3, and, based on the first to third phase detection signals PD1 to PD3, may generate a first phase locking signal PL1. Since the first phase locking detector 610 is configured to receive three phase detection signals, the first phase locking detector 610 may further include additional components in addition to those of the first phase locking detector 310 illustrated in FIG. 3. The first phase locking detector 610 may include a first flip-flop 611, a second flip-flop 612, a third flip-flop 613, a fourth flip-flop 614, a fifth flip-flop 615, a sixth flip-flop 616 and a first gating circuit 617. The first and second flip-flops 611 and 612 may be a first locking detector for, based on the first phase detection signal PD1, generating a first locking signal LOCK1. The first flip-flop 611 may have an input terminal D configured to receive a supply voltage VDD and a clock terminal configured to receive the first phase detection signal PD1. The second flip-flop 612 may have an input terminal D coupled to an output terminal Q of the first flip-flop 611, and may be configured to receive a signal outputted from the first flip-flop 611. The second flip-flop 612 may have a clock terminal configured to receive an inverted signal of the first phase detection signal PD1, and an output terminal Q configured to output the first locking signal LOCK1. When a previously received first phase detection signal PD1 has a high logic level and a currently received first phase detection signal PD1 has a low logic level, the first and second flip-flops 611 and 612 may output the supply voltage VDD as the first locking signal LOCK1, and thus enable the first locking signal LOCK1 to a high logic level.

The third and fourth flip-flops 613 and 614 may be a second locking detector for, based on the second phase detection signal PD2, generating a second locking signal LOCK2. The third flip-flop 613 may have an input terminal D configured to receive the supply voltage VDD and a clock terminal configured to receive the second phase detection signal PD2. The fourth flip-flop 614 may have an input terminal D coupled to an output terminal Q of the third flip-flop 613. Further, the fourth flip-flop 614 may be configured to receive a signal outputted from the third flip-flop 613. The fourth flip-flop 614 may have a clock terminal configured to receive an inverted signal of the second phase detection signal PD2, and an output terminal Q configured to output the second locking signal LOCK2. When a previously received second phase detection signal PD2 has a high logic level and a currently received second phase detection signal PD2 has a low logic level, the third and fourth flip-flops 613 and 614 may output the supply voltage VDD as the second locking signal LOCK2, thus enabling the second locking signal LOCK2 to a high logic level.

The fifth and sixth flip-flops 615 and 616 may be a third locking detector for, based on the third phase detection signal PD3, generating a third locking signal LOCK3. The fifth flip-flop 615 may have an input terminal D configured to receive the supply voltage VDD and a clock terminal configured to receive the third phase detection signal PD3. The sixth flip-flop 616 may have an input terminal D coupled to an output terminal of the fifth flip-flop 615, and may be configured to receive a signal outputted from the fifth flip-flop 615. The sixth flip-flop 616 may have a clock terminal configured to receive an inverted signal of the third phase detection signal PD3, and an output terminal configured to output the third locking signal LOCK3. When a previously received third phase detection signal PD3 has a high logic level and a currently received third phase detection signal PD3 has a low logic level, the fifth and sixth flip-flops 615 and 616 may output the supply voltage VDD as the third locking signal LOCK3, and thus enable the third locking signal LOCK3 to a high logic level.

The first gating circuit 617 may receive the first to third locking signals LOCK1 to LOCK3, and output the first phase locking signal PL1. When the first to third locking signals LOCK1 to LOCK3 are all enabled, the first gating circuit 617 may enable the first phase locking signal PL1. The first gating circuit 617 may include an AND gate. The first gating circuit 617 may output the first phase locking signal PL1 which is enabled to a high logic level when the first to third locking signals LOCK1 to LOCK3 are all enabled to a high logic level.

The second phase locking detector 620 may generate a second phase locking signal PL2 based on the first delay control signal D1<1:n>, the second delay control signal D2<1:n>, the third delay control signal D3<1:n> and the fourth delay control signal D4<1:n>. Based on at least some bits of the first to fourth delay control signals D1<1:n> to D4<1:n>, the second phase locking detector 620 may generate the second phase locking signal PL2. For example, the second phase locking detector 620 may receive the least significant bits of the first to fourth delay control signals D1<1:n> to D4<1:n>, and detect the logic levels of the least significant bits and enable the second phase locking signal PL2. When any one of the least significant bits of the first to fourth delay control signals D1<1:n> to D4<1:n> becomes a low logic level, the second phase locking detector 620 may enable the second phase locking signal PL2. When any one of the first to fourth delay circuits 510, 520, 530 and 540 has a minimum delay time, the second phase locking detector 620 may enable the second phase locking signal PL2. The second phase locking detector 620 may include a NAND gate 631. The NAND gate 631 may receive the least significant bits of the first to fourth delay control signals D1<1:n> to D4<1:n>, and output the second phase locking signal PL2. When any one of the least significant bits of the first to fourth delay control signals D1<1:n> to D4<1:n> transitions to a logic low level, the NAND gate 631 may enable the second phase locking signal PL2 to a high logic level.

The delay control signal generation circuit 630 may receive the first to third phase detection signals PD1 to PD3 and the first and second phase locking signals PL1 and PL2, and generate the first to fourth delay control signals D1<1:n> to D4<1:n>. The delay control signal generation circuit 630 may output the first to fourth delay control signals D1<1:n> to D4<1:n> having the default value in the initial state. The delay control signal generation circuit 630 may, based on the first to third phase detection signals PD1 to PD3, change the logic values of the second to fourth delay control signals D2<1:n> to D4<1:n> until the first phase locking signal PL1 is enabled. For example, when the first to third phase detection signals PD1 to PD3 all are at a high logic level, the delay control signal generation circuit 630 may increase the logic values of the second to fourth delay control signals D2<1:n> to D4<1:n>. When the first to third phase detection signals PD1 to PD3 all are at a low logic level, the delay control signal generation circuit 630 may decrease the logic values of the second to fourth delay control signals D2<1:n> to D4<1:n>. When the first phase locking signal PL1 is enabled, the delay control signal generation circuit 630 may change the logic values of the first to fourth delay control signals D1<1:n> to D4<1:n>. For example, the delay control signal generation circuit 630 may sequentially decrease the logic values of the first to fourth delay control signals D1<1:n> to D4<1:n>. The delay control signal generation circuit 630 may sequentially change the logic values of the first to fourth delay control signals D1<1:n> to D4<1:n> to a low logic level from the most significant bits having a high logic level. The delay control signal generation circuit 630 may decrease the logic values of the first to fourth delay control signals D1<1:n> to D4<1:n> until the second phase locking signal PL2 is enabled. When the second phase locking signal PL2 is enabled, the delay control signal generation circuit 630 may retain the logic values of the first to fourth delay control signals D1<1:n> to D4<1:n>. Therefore, the delay control signal generation circuit 630 may decrease the logic values of the first to fourth delay control signals D1<1:n> to D4<1:n> by the logic value of the delay control signal having the smallest logic value among the first to fourth delay control signals D1<1:n> to D4<1:n>, thereby setting the first to fourth variable delay times to the minimum delay time.

Figure 7:
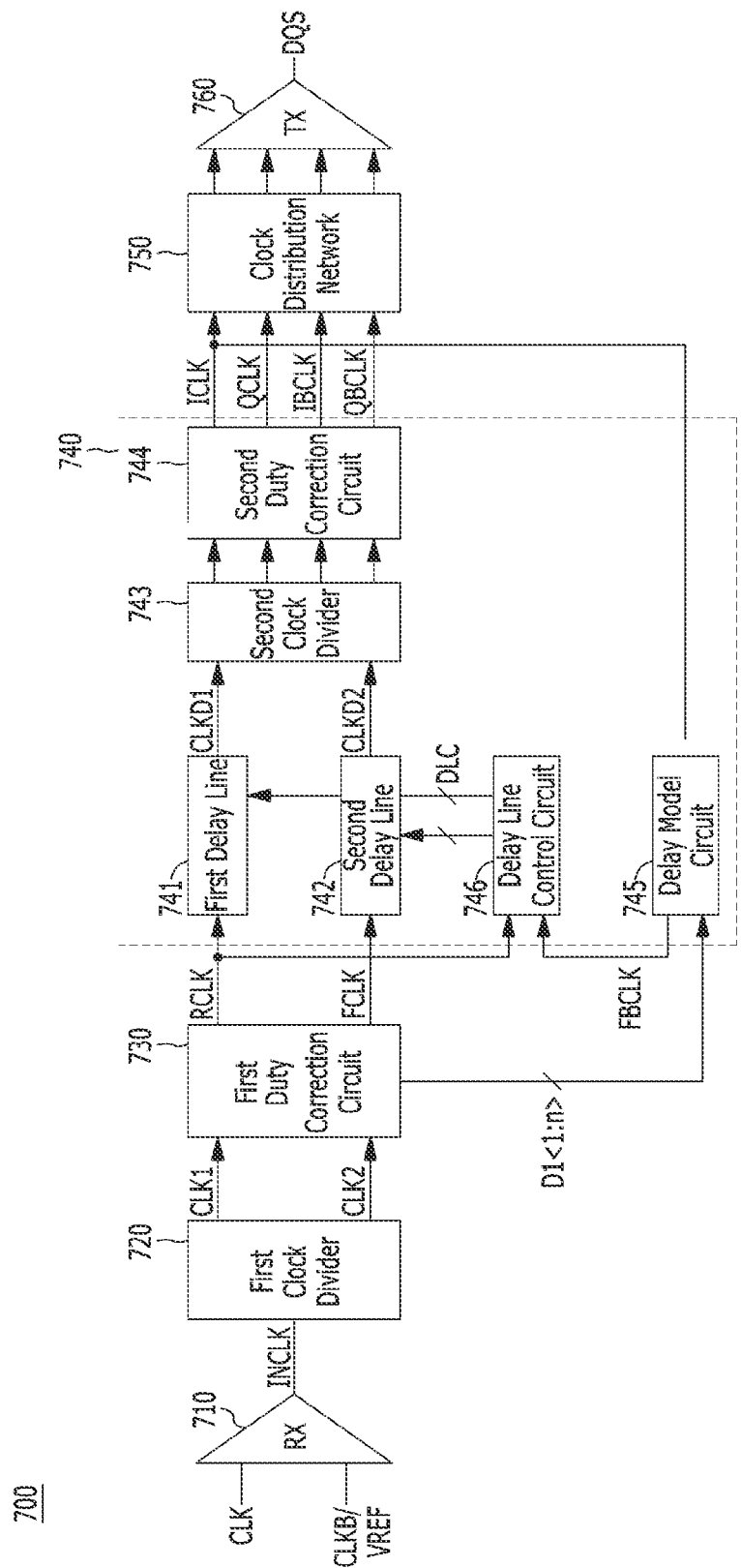
FIG. 7 is a block diagram illustrating a configuration of a semiconductor apparatus in accordance with an embodiment.

FIG. 7 is a block diagram illustrating a configuration of a semiconductor apparatus 700 in accordance with an embodiment. Referring to FIG. 7, the semiconductor apparatus 700 may include a clock receiver 710, a first clock divider 720, a first duty correction circuit 730 and a delay locked loop circuit 740. The clock receiver 710 may receive a system clock signal CLK transmitted from the outside of the semiconductor apparatus 700, and may generate an input clock signal INCLK, wherein the system clock signal CLK may be transmitted as a differential signal or a single-ended signal. When the system clock signal CLK is transmitted as a differential signal, the clock receiver 710 may generate the input clock signal INCLK by differentially amplifying the system clock signal CLK and a complementary signal CLKB. When the system clock signal CLK is transmitted as a single-ended signal, the input clock signal INCLK may be generated by the clock receiver 710 by differentially amplifying the system clock signal CLK and a reference voltage VREF. The reference voltage VREF may have a voltage level corresponding to the middle of the swing range of the system clock signal CLK.

The first clock divider 720 may generate a first divided clock signal CLK1 and a second divided clock signal CLK2 by dividing the input clock signal INCLK. By dividing the frequency of the input clock signal INCLK, the first clock divider 720 may generate the first and second divided clock signals CLK1 and CLK2 having a lower frequency than the input clock signal INCLK. For example, the first clock divider 720 may divide the frequency of the input clock signal INCLK by 2, and the frequencies of the first and second divided clock signals CLK1 and CLK2 may both correspond to ½ of the frequency of the input clock signal INCLK. The first divided clock signal CLK1 may have a phase difference of 180 degrees from the second divided clock signal CLK2.

The first duty correction circuit 730 may receive the first and second divided clock signals CLK1 and CLK2, and generate a first reference clock signal RCLK and a second reference clock signal FCLK. By delaying the first and second divided clock signals CLK1 and CLK2, the first duty correction circuit 730 may generate the first and second reference clock signals RCLK and FCLK. The first duty correction circuit 730 may compare the phases of the first and second reference clock signals RCLK and FCLK, and adjust the time by which the second divided clock signal CLK2 is delayed. After adjusting the time by which the second divided clock signal CLK2 is delayed, the first duty correction circuit 730 may decrease the times by which the first and second divided clock signals CLK1 and CLK2 are delayed by the time. The signal generation circuit 100 illustrated in FIG. 1 may be applied as the first duty correction circuit 730 so that the first and second divided clock signals CLK1 and CLK2 may correspond to the first and second input signals IN1 and IN2 of FIG. 1, and the first and second reference clock signals RCLK and FCLK may correspond to the first and second output signals OUT1 and OUT2 of FIG. 1. The first duty correction circuit 730 may minimize a delay time required for adjusting the phases and duty ratios of the first and second reference clock signals RCLK and FCLK.

The delay locked loop circuit 740 may receive the first and second reference clock signals RCLK and FCLK, and may generate one or more output clock signals by performing a delay locking operation on the first and second reference clock signals RCLK and FCLK. For example, the delay locked loop circuit 740 may generate first to fourth output clock signals ICLK, QCLK, IBCLK and QBCLK. However, the delay locked loop circuit 740 may be modified to generate output clock signals more or less than four. By comparing the phases of the first reference clock signal RCLK and a feedback clock signal FBCLK and delaying the first and second reference clock signals RCLK and FCLK, the delay locked loop circuit 740 may generate one or more output clock signals. The delay locked loop circuit 740 may generate the feedback clock signal FBCLK by delaying the one or more output clock signals.

The delay locked loop circuit 740 may include a first delay line 741, a second delay line 742, a second clock divider 743, a second duty correction circuit 744, a delay model circuit 745 and a delay line control circuit 746. By delaying the first reference clock signal RCLK based on a delay line control signal DLC, the first delay line 741 may receive the first reference clock signal RCLK, and generate a first delayed clock signal CLKD1. The first delay line 741 may have a delay time that is decided based on the delay line control signal DLC. The second delay line 742 may receive the second reference clock signal FCLK, and generate a second delayed clock signal CLKD2 by delaying, based on the delay line control signal DLC, the second reference clock signal FCLK. The second delay line 742 may have a delay time that is decided based on the delay line control signal DLC.

The second clock divider 743 may receive the first and second delayed clock signals CLKD1 and CLKD2, and divide the first and second delayed clock signals CLKD1 and CLKD2. When the second clock divider 743 divides the frequencies of the first and second delayed clock signals CLKD1 and CLKD2, four divided clock signals are output. For example, the second clock divider 743 may divide the frequencies of the first and second delayed clock signals CLKD1 and CLKD2 by 2, and generate the four divided clock signals which sequentially have a phase difference of 90 degrees.

The second duty correction circuit 744 may receive the four divided clock signals outputted from the second clock divider 743, and generate one or more output clock signals, such as, for example, a first output clock signal ICLK, a second output clock signal QCLK, a third output clock signal IBCLK and a fourth output clock signal QBCLK. The one or more output clock signals may, for example, be the first output clock signal ICLK. The second duty correction circuit 744 may detect the phases of the first to fourth output clock signals ICLK, QCLK, IBCLK and QBCLK, and adjust the phases and/or duty ratios of the first to fourth output clock signals ICLK, QCLK, IBCLK and QBCLK. The second duty correction circuit 744 may be implemented as any publicly known duty correction circuit. In an embodiment, the signal generation circuit 500 illustrated in FIG. 5 may be applied as the second duty correction circuit 744. The four divided clock signals outputted from the second clock divider 743 may correspond to the first to fourth input clock signals ICLK1, ICLK2, ICLK3 and ICLK4 of FIG. 5, and the first to fourth output clock signals ICLK, QCLK, IBCLK and QBCLK may correspond to the first to fourth phase clock signals OCLK1, OCLK2, OCLK3 and OCLK4 of FIG. 5.

The delay model circuit 745 may generate the feedback clock signal FBCLK by delaying the one or more output clock signals. The delay model circuit 745 may receive the first output clock signal ICLK, and generate, by delaying the first output clock signal ICLK by a modeled delay time, the feedback clock signal FBCLK. The modeled delay time may correspond to a delay time which occurs in a path through which a clock signal propagates in the semiconductor apparatus 700. The delay model circuit 745 may have a fixed delay time and a variable delay time, wherein the fixed delay time may be a constant delay time, and the variable delay time may be a delay time which may be changed in various manners. By modeling delay times caused by the circuits other than the first duty correction circuit 730, among the delay times which occur in the paths through which the clock signal propagates in the semiconductor apparatus 700, the fixed delay time may be obtained. The variable delay time may be changed in substantially the same manner as the delay time of the first duty correction circuit 730. For example, the delay model circuit 745 may include a delay circuit having a similar structure in comparison with the delay circuit included in the first duty correction circuit 730. Instead, the delay model circuit 745 may have a variable delay time corresponding to ½ of the delay time of the delay circuit. That is, the maximum value of the variable delay time may be ½ of the delay time of the delay circuit, and may correspond to a reference delay time. Based on a delay control signal which is used in the first duty correction circuit 730, the delay model circuit 745 may change the variable delay time. When the first delay control signal D1<1:n> is being used to adjust the delay time of the first delay circuit 110 in FIG. 1, for example, the delay model circuit 745 may receive the first delay control signal D1<1:n> from the first duty correction circuit 730. The variable delay time of the delay model circuit 745 may be decreased by a delay time which is decreased in the delay circuit of the first duty correction circuit 730. Therefore, the delay locked loop circuit 740 may perform the delay locking operation more accurately, and may reduce the total delay time of the paths through which the clock signal has propagated.

The delay line control circuit 746 may receive the first reference clock signal RCLK and the feedback clock signal FBCLK, and generate the delay line control signal DLC by comparing the phases of the first reference clock signal RCLK and the feedback clock signal FBCLK. By changing the logic value of the delay line control signal DLC according to a phase difference between the first reference clock signal RCLK and the feedback clock signal FBCLK, the delay line control circuit 746 may change the delay times of the first and second delay lines 741 and 742.

The semiconductor apparatus 700 may further include a clock distribution network 750 and a clock transmitter 760. The clock distribution network 750 may receive the one or more output clock signals generated by the delay locked loop circuit 740, and may transmit the one or more output clock signals. The clock distribution network 750 may receive the first to fourth output clock signals ICLK, QCLK, IBCLK and QBCLK, and transmit the first to fourth output clock signals ICLK, QCLK, IBCLK and QBCLK. The clock distribution network 750 may be coupled to a plurality of data input/output circuits (not illustrated), and may transmit the first to fourth output clock signals ICLK, QCLK, IBCLK and QBCLK to the plurality of data input/output circuits. The clock distribution network 750 may include transmission lines, repeaters and the like, which are configured to transmit the first to fourth output clock signals ICLK, QCLK, IBCLK and QBCLK.

The clock transmitter 760 may receive an output of the clock distribution network 750, may generate a data strobe signal DQS, and may transmit the data strobe signal DQS to the outside of the semiconductor apparatus 700, wherein the data strobe signal DQS may be a clock signal synchronized with data outputted from the plurality of data input/output circuits. FIG. 7 illustrates one clock transmitter, but the clock transmitter may be provided in each of the data input/output circuits.

Figure 8:
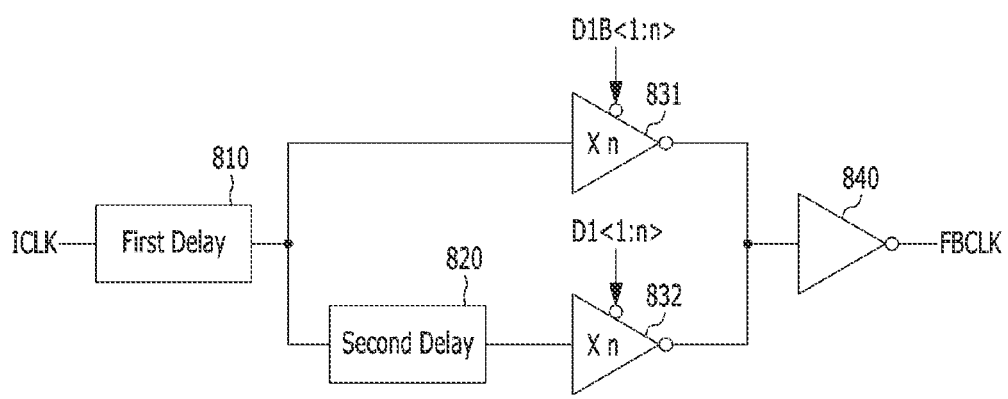
FIG. 8 is a diagram illustrating a configuration of a delay model circuit illustrated in FIG. 7.

FIG. 8 is a diagram illustrating a configuration of the delay model circuit 745 illustrated in FIG. 7. Referring to FIG. 8, the delay model circuit 745 may include a first delay 810, a second delay 820, a first driver group 831, a second driver group 832 and an output inverter 840. The first delay 810 may receive the first output clock signal ICLK, may delay the first output clock signal ICLK, and may have a delay amount corresponding to the fixed delay time of the delay model circuit 745. The second delay 820 may receive an output of the first delay 810, and may delay the output of the first delay 810. The maximum value of a delay amount of the second delay 820 may be set to a delay time corresponding to ½ of the maximum delay time of a delay circuit (for example, the first delay circuit 110 of FIG. 1) constituting the first duty correction circuit 730, and the delay amount of the second delay 820 may correspond to the reference delay time. Based on the delay control signal D1<1:n> provided from the duty control circuit constituting the first duty correction circuit 730, the delay model circuit 745 may change weights of the first and second driver groups 831 and 832, and thus may change the time by which the first output clock signal ICLK is delayed. Each of the first and second driver groups 831 and 832 may receive the delay control signal D1<1:n>.

The first driver group 831 may receive a signal outputted from the first delay 810. Based on the delay control signal D1<1:n>, the first driver group 831 may invert the signal, outputted from the first delay 810, with variable drivability. The drivability of the first driver group 831 may be changed based on the inverted signal of the delay control signal D1<1:n>. The first driver group 831 may include a plurality of inverters corresponding to the respective bits of the delay control signal D1<1:n>. The inverters may each receive one bit of the delay control signal D1<1:n>. For example, as the number of bits having a low logic level among the bits of the delay control signal D1<1:n> increases, the drivability of the first driver group 831 may be increased, and the delay time of the delay model circuit 745 may be shortened.

The second driver group 832 may receive a signal outputted from the second delay 820. Based on the delay control signal D1<1:n>, the second driver group 832 may invert the signal, outputted from the second delay 820, with variable drivability. The drivability of the second driver group 832 may be changed based on the delay control signal D1<1:n>. The second driver group 832 may include a plurality of inverters corresponding to the respective bits of the delay control signal D1<1:n>, wherein the inverters may each receive one bit of the delay control signal D1<1:n>. For example, as the number of bits having a high logic level among the bits of the delay control signal D1<:n> increases, the drivability of the second driver group 832 may be increased, and the delay time of the delay model circuit 745 may be lengthened.

The output inverter 840 may be coupled to the first and second driver groups 831 and 832 in common, and receive outputs of the first and second driver groups 831 and 832. By inverting the outputs of the first and second driver groups 831 and 832, the output inverter 840 may generate the feedback clock signal FBCLK. The output inverter 840 may generate the feedback clock signal FBCLK by mixing the phases of the outputs of the first and second driver groups 831 and 832, which are generated according to a weight decided based on the delay control signal D1<1:n>.

The delay model circuit 745 may have a minimum delay time set to a delay time corresponding to the delay amount of the first delay 810, and a maximum delay time set to a delay time corresponding to the sum of the delay amounts of the first and second delays 810 and 820. A delay time which is changed in the first duty correction circuit 730 may change the delay time of the delay model circuit 745.

Figure 9:
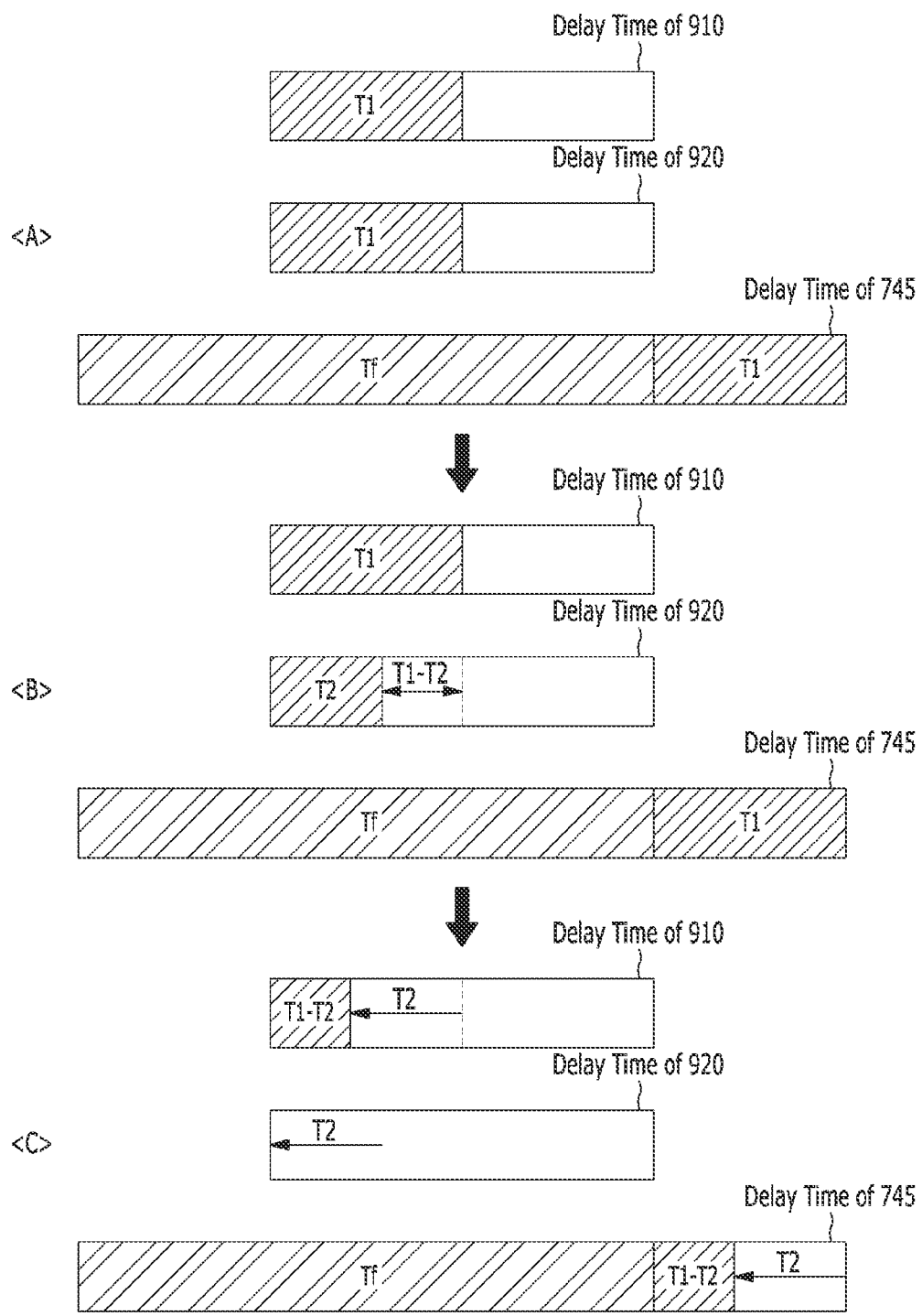
FIG. 9 is a block diagram illustrating an operation of a semiconductor apparatus in accordance with an embodiment.

FIG. 9 is a block diagram illustrating an operation of the semiconductor apparatus 700 in accordance with the present embodiment. In FIG. 9, bar graphs indicate a delay time of a delay circuit 910 of the first duty correction circuit 730 which delays the first divided clock signal CLK1, a delay time of a delay circuit 920 of the first duty correction circuit 730 which delays the second divided clock signal CLK2, and a delay time of the delay model circuit 745 which delays the first output clock signal ICLK. Referring to FIGS. 7 to 9, the operation of the semiconductor apparatus 700 in accordance with the present embodiment will be described as follows. When the clock receiver 710 receives the system clock signal CLK and generates the input clock signal INCLK, by dividing the input clock signal INCLK, the first clock divider 720 may generate the first and second divided clock signals CLK1 and CLK2. In the initial state as illustrated in <A>, the delay time of the delay circuit 910 for delaying the first divided clock signal CLK1 may be set to a first time T1, and the delay time of the delay circuit 920 for delaying the second divided clock signal CLK2 may also be set to the first time T1. The delay time of the delay model circuit 745 may be set to the sum of a fixed delay time Tf and the first time T1. Ideally, the first and second divided clock signals CLK1 and CLK2 need to have a phase difference of 180 degrees therebetween, and each has a duty ratio of 50:50. However, the first and second divided clock signals CLK1 and CLK2 may have neither a phase difference of 180 degrees therebetween nor a duty ratio of 50:50, depending on the characteristics of the clock receiver 710 and the first clock divider 720. Therefore, by variably delaying the first and second divided clock signals CLK1 and CLK2, the first duty correction circuit 730 may generate the first and second reference clock signals RCLK and FCLK, thereby adjusting the phase difference between the first to second reference clock signals RCLK and FCLK to 180 degrees, and adjusting the duty ratios of the first and second reference clock signals RCLK and FCLK to 50:50. For example, when the delay time of the delay circuit 920 for delaying the second reference clock signal FCLK is decreased in order to adjust the phase and/or duty ratio of the second reference clock signal FCLK, as illustrated in <B>, the delay time of the delay circuit 910 for delaying the first reference clock signal RCLK may be retained as the first time T1, and the delay time of the delay circuit 920 for delaying the second reference clock signal FCLK may become a second time T2. That is, the delay time of the delay circuit 920 may be decreased by a difference T1−T2 between the first time and the second time. The delay time of the delay model circuit 745 may still be retained as the sum of the fixed delay time Tf and the first time T1.

Then, the first duty correction circuit 730 may decrease the delay times of the delay circuits 910 and 920 and the delay time of the delay model circuit 745 together. The second time T2 may be the minimum delay time between the delay times of the delay circuits 910 and 920 for delaying the first and second reference clock signals RCLK and FCLK. The delay times of the delay circuits 910 and 920 and the delay model circuit 745 may be all decreased by the second time T2. As illustrated by <C>, the delay time of the delay circuit 910 for delaying the first reference clock signal RCLK may be set to the time T1−T2, which is obtained by subtracting the second time from the first time, and the delay time of the delay circuit 920 for delaying the second reference clock signal FCLK may be substantially zero. The delay time of the delay model circuit 745 may be set to the sum of the fixed delay time Tf and the time T1−T2, which is obtained by subtracting the second time from the first time. Therefore, the delay times of the delay circuits 910 and 920 and the delay model circuit 745 may be all set to the minimum time.

Figure 10:
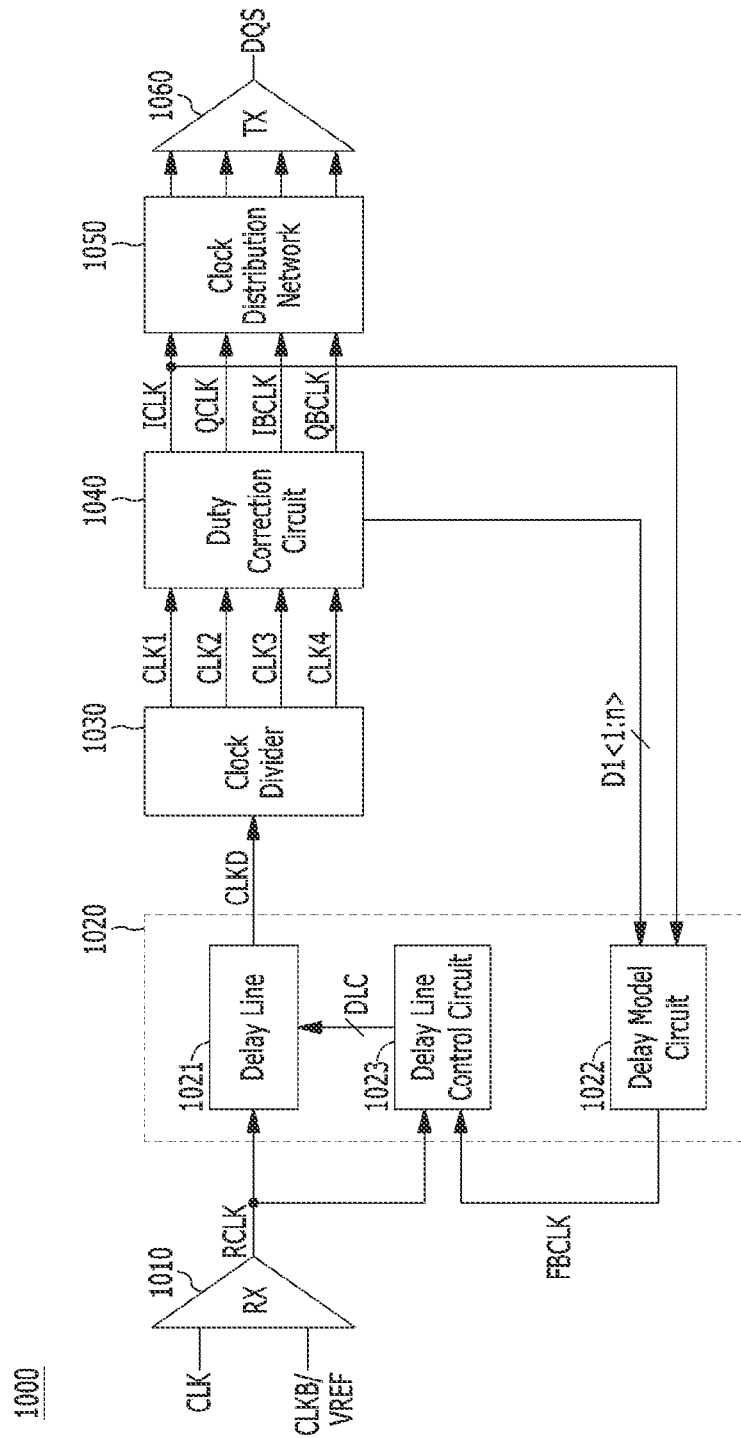
FIG. 10 is a block diagram illustrating an operation of a semiconductor apparatus in accordance with an embodiment.

FIG. 10 is a block diagram illustrating a configuration of a semiconductor apparatus 1000 in accordance with an embodiment. Referring to FIG. 10, the semiconductor apparatus 1000 may include a clock receiver 1010, a delay locked loop circuit 1020, a clock divider 1030, a duty correction circuit 1040, a clock distribution network 1050 and a clock transmitter 1060. In FIG. 7, the first duty correction circuit 730 may be disposed between the delay locked loop circuit 740 and the first clock divider 720 which receives an output of the clock receiver 710. In FIG. 10, however, the duty correction circuit 1040 may be disposed between the clock distribution network 1050 and the clock divider 1030 which receives an output of the delay locked loop circuit 1020. The semiconductor apparatus 1000 may include similar components to those of the semiconductor apparatus 700 illustrated in FIG. 7, and overlapping descriptions of the same functions and operations of the similar components will be omitted herein. The clock receiver 1010 may receive a system clock signal CLK and generate a reference clock signal RCLK.

By performing a delay locking operation on the reference clock signal RCLK, the delay locked loop circuit 1020 may generate a delayed clock signal CLKD. The delay locked loop circuit 1020 may compare the phase of the reference clock signal RCLK to the phase of a feedback clock signal FBCLK generated by delaying a first output clock signal ICLK, and variably delay the reference clock signal RCLK. By variably delaying the reference clock signal RCLK, the delay locked loop circuit 1020 may generate the delayed clock signal CLKD. The delay locked loop circuit 1020 may include a delay line 1021, a delay model circuit 1022 and a delay line control circuit 1023. By variably delaying the reference clock signal RCLK based on a delay line control signal DLC, the delay line 1021 may generate the delayed clock signal CLKD. The delay model circuit 1022 may receive the first output clock signal ICLK generated through the duty correction circuit 1040, and generate the feedback clock signal FBCLK by delaying the first output clock signal ICLK. The delay model circuit 1022 may receive a delay control signal D1<1:n> to be used in the duty correction circuit 1040 which will be described below, and have a delay time that is changed based on the delay control signal D1<1:n>. By comparing the phases of the reference clock signal RCLK and the feedback clock signal FBCLK, the delay line control circuit 1023 may generate the delay line control signal DLC.

The clock divider 1030 may receive the delayed clock signal CLKD from the delay locked loop circuit 1020. The clock divider 1030 may generate, by dividing the delayed clock signal CLKD, at least first and second divided clock signals CLK1 and CLK2. The clock divider 1030 may generate, by dividing the frequency of the delayed clock signal CLKD by 2, the first and second divided clock signals CLK1 and CLK2 having a phase difference of 90 degrees therebetween. By inverting the first and second divided clock signals CLK1 and CLK2, the clock divider 1030 may generate four divided clock signals. The clock divider 1030 may generate a third divided clock signal CLK3 having a phase difference of 180 degrees from the first divided clock signal CLK1 and a fourth divided clock signal CLK4 having a phase difference of 180 degrees from the second divided clock signal CLK2. Ideally, the first to fourth divided clock signals CLK1 to CLK4 need to sequentially have a phase difference of 90 degrees, and each have a duty ratio of 50:50. However, the phase differences and duty ratios of the first to fourth divided clock signals CLK1 to CLK4 may be changed depending on characteristic and process variations of the clock divider 1030. The duty correction circuit 1040 may be provided to compensate for a change in phase and duty ratio by the clock divider 1030.

The duty correction circuit 1040 may receive at least the first and second divided clock signals CLK1 and CLK2, and generate the first output clock signal ICLK and a second output clock signal QCLK. The duty correction circuit 1040 may generate, by delaying the first and second divided clock signals CLK1 and CLK2, the first and second output clock signals ICLK and QCLK, and compare the phases of the first and second output clock signals ICLK and QCLK to adjust the time by which the second output clock signal QCLK is delayed. After adjusting the time by which the second output clock signal QCLK is delayed, the duty correction circuit 1040 may decrease the times by which the first and second output clock signals ICLK and QCLK are delayed, by the same time. At this time, based on the delay control signal D1<1:n> for setting the time by which the first output clock signal ICLK is delayed, the delay time of the delay model circuit 1022 may be decreased by as much as the decrease in delay time of the first output clock signal ICLK. The signal generation circuit 100 illustrated in FIG. 1 may be applied as the duty correction circuit 1040. The first and second divided clock signals CLK1 and CLK2 may correspond to the first and second input signals IN1 and IN2 of FIG. 1, and the first and second output clock signals ICLK and QCLK may correspond to the first and second output signals OUT1 and OUT2 of FIG. 1. The duty correction circuit 1040 may additionally receive the third and fourth divided clock signals CLK3 and CLK4 in addition to the first and second divided clock signals CLK1 and CLK2. When the duty correction circuit 1040 receives the first to fourth divided clock signals CLK1 to CLK4 together, the signal generation circuit 500 illustrated in FIG. 5 may be applied as the duty correction circuit 1040. The first to fourth divided clock signals CLK1 to CLK4 may correspond to the first to fourth input clock signals ICLK1 to ICLK4 of FIG. 5, and the first to fourth output clock signals ICLK, QCLK, IBCLK and QBCLK may correspond to the first to fourth phase clock signals OCLK1 to OCLK4 of FIG. 5. The clock distribution network 1050 may transmit the first to fourth output clock signals ICLK, QCLK, IBCLK and QBCLK outputted from the duty correction circuit 1040, and, based on an output of the clock distribution network 1050, the clock transmitter 1060 may generate a data strobe signal DQS.

Figure 11:
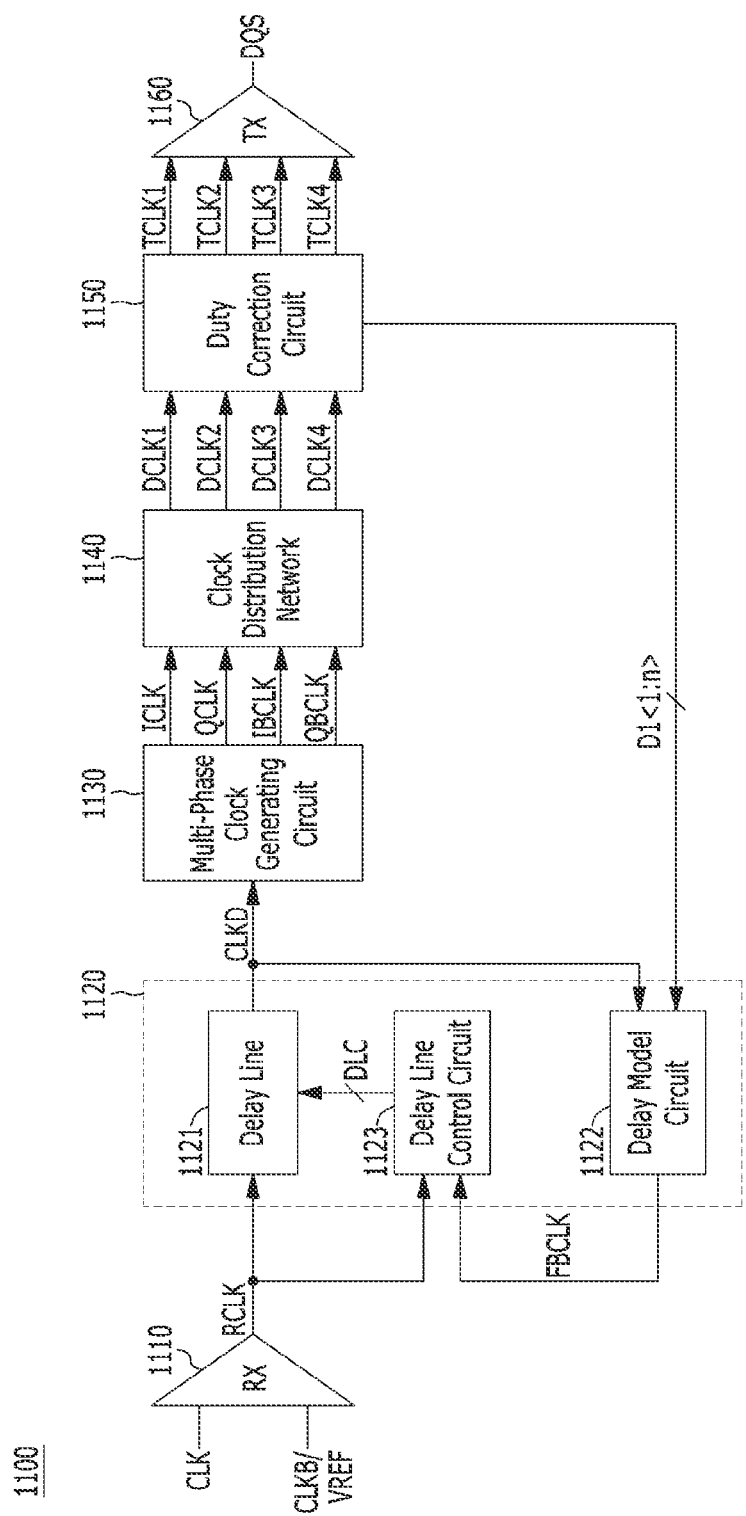
FIG. 11 is a block diagram illustrating an operation of a semiconductor apparatus in accordance with an embodiment.

FIG. 11 is a block diagram illustrating a configuration of a semiconductor apparatus 1100 in accordance with an embodiment. Referring to FIG. 11, the semiconductor apparatus 1100 may include a clock receiver 1110, a delay locked loop circuit 1120, a multi-phase clock generation circuit 1130, a clock distribution network 1140, a duty correction circuit 1150 and a clock transmitter 1060. In FIG. 7, the duty correction circuit 730 is disposed between the delay locked loop circuit 740 and the first clock divider 720 which receives an output of the clock receiver 710, and in FIG. 10, the duty correction circuit 1040 is disposed between the clock distribution network 1050 and the clock divider 1030 which receives an output of the delay locked loop circuit 1020. In FIG. 11, however, the duty correction circuit 1150 may be disposed between the clock distribution network 1140 and the clock transmitter 1160. The semiconductor apparatus 1100 may include components similar to those of the semiconductor apparatus 700 or 1000 illustrated in FIG. 7 or 10, and overlapping descriptions of the same functions and operations of the similar components will be omitted herein. The clock receiver 1110 may receive a system clock signal CLK and generate a reference clock signal RCLK.

By performing a delay locking operation on the reference clock signal RCLK, the delay locked loop circuit 1120 may generate a delayed clock signal CLKD. The delay locked loop circuit 1120 may compare the phase of the reference clock signal RCLK to the phase of a feedback clock signal FBCLK generated by delaying the delayed clock signal CLKD, and change the time by which the reference clock signal RCLK is delayed. The delay locked loop circuit 1120 may include a delay line 1121, a delay model circuit 1122 and a delay line control circuit 1123. The delay line 1121 may delay the reference clock signal RCLK based on a delay line control signal DLC, and output the delayed clock signal CLKD. By delaying the delayed clock signal CLKD, the delay model circuit 1122 may generate the feedback clock signal FBCLK. The delay model circuit 1122 may receive a delay control signal D1<1:n> which is used in the duty correction circuit 1150 to be described below, and have a delay time that is changed based on the delay control signal D1<1:n>. By comparing the phases of the reference clock signal RCLK and the feedback clock signal FBCLK, the delay line control circuit 1123 may generate the delay line control signal DLC.

The multi-phase clock generation circuit 1130 may receive the delayed clock signal CLKD outputted from the delay locked loop circuit 1120. The multi-phase clock generating circuit 1130 may generate at least the first output clock signal ICLK and the second output clock signal QCLK based on the delayed clock signal CLKD. The multi-phase clock generation circuit 1130 may include a clock divider (not illustrated), and generate the first and second output clock signals ICLK and QCLK having a phase difference of 90 degrees therebetween by dividing the frequency of the delayed clock signal CLKD through the clock divider. The multi-phase clock generation circuit 1130 may further generate third and fourth output clock signals IBCLK and QBCLK, wherein the third output clock signal IBCLK may have a phase difference of 180 degrees from the first output clock signal ICLK, and the fourth output clock signal QBCLK may have a phase difference of 180 degrees from the second output clock signal QCLK.

The clock distribution network 1140 may receive at least the first and second output clock signals ICLK and QCLK, and output a first distribution clock signal DCLK1 and a second distribution clock signal DCLK2. The clock distribution network 1140 may drive the first and second output clock signals ICLK and QCLK, and may output the first and second distribution clock signals DCLK1 and DCLK2, wherein the first distribution clock signal DCLK1 may have a phase corresponding to the first output clock signal ICLK, and the second distribution clock signal DCLK2 may have a phase corresponding to the second output clock signal QCLK. The clock distribution network 1140 may further receive the third and fourth output clock signals IBCLK and QBCLK, and further output a third distribution clock signal DCLK3 and a fourth distribution clock signal DCLK4. The third distribution clock signal DCLK3 may have a phase corresponding to the third output clock signal IBCLK, and the fourth distribution clock signal DCLK4 may have a phase corresponding to the fourth output clock signal QBCLK. Ideally, the first to fourth distribution clock signals DCLK1 to DCLK4 need to sequentially have a phase difference of 90 degrees therebetween, and each have a duty ratio of 50:50. However, the phase differences and duty ratios of the first to fourth distribution clock signals DCLK1 to DCLK4 may be changed depending on characteristic and process variations of the clock distribution network 1140. Since the clock distribution network 1140 includes a long clock transmission line through which the clock signals are transmitted, it is difficult to maintain the phase differences and duty ratios of the first to fourth output clock signals ICLK, QCLK, IBCLK and QBCLK. The duty correction circuit 1050 may be provided to compensate for a change in phase and duty ratio by the clock distribution network 1140.

The duty correction circuit 1150 may receive at least the first and second distribution clock signals DCLK1 and DCLK2, and generate a first transmission clock signal TCLK1 and a second transmission clock signal TCLK2. The duty correction circuit 1150 may generate, by delaying the first and second distribution clock signals DCLK1 and DCLK2, the first and second transmission clock signals TCLK1 and TCLK2, and compare the phases of the first and second transmission clock signals TCLK1 and TCLK2 to adjust the time by which the second distribution clock signal DCLK2 is delayed. After adjusting the time by which the second distribution clock signal DCLK2 is delayed, the duty correction circuit 1150 may decrease the times, by which the first and second distribution clock signals DCLK1 and DCLK2 are delayed, by the same time. At this time, based on the delay control signal D1<1:n> for setting the time by which the first distribution clock signal DCLK1 is delayed, the delay time of the delay model circuit 1122 may be decreased as much as the decrease in delay time of the first distribution clock signal DCLK1. The signal generation circuit 100 illustrated in FIG. 1 may be applied as the duty correction circuit 1150. The first and second distribution clock signals DCLK1 and DCLK2 may correspond to the first and second input signals IN1 and IN2 of FIG. 1, and the first and second transmission clock signals TCLK1 and TCLK2 may correspond to the first and second output signals OUT1 and OUT2 of FIG. 1. The duty correction circuit 1150 may further receive the third and fourth distribution clock signals DCLK3 and DCLK4, and further generate a third transmission clock signal TCLK3 and a fourth transmission clock signal TCLK4. The duty correction circuit 1150 may generate, by delaying the first to fourth distribution clock signals DCLK1 to DCLK4, the first to fourth transmission clock signals TCLK1, TCLK2, TCLK3 and TCLK4, and compare the phases of the first to fourth distribution clock signals DCLK1 to DCLK4 to adjust the times by which the second to fourth distribution clock signals DCLK2 to DCLK4 are delayed. After adjusting the times by which the second to fourth distribution clock signals DCLK2 to DCLK4 are delayed, the duty correction circuit 1150 may decrease the times, by which the first to fourth distribution clock signals DCLK1 to DCLK4 are delayed, by the same time. At this time, based on the delay control signal D1<1:n> for setting the time by which the first distribution clock signal DCLK1 is delayed, the delay time of the delay model circuit 1122 may be decreased as much as the decrease in delay time of the first distribution clock signal DCLK1. The signal generation circuit 500 illustrated in FIG. 5 may be applied as the duty correction circuit 1150. The first to fourth distribution clock signals DCLK1 to DCLK4 may correspond to the first to fourth input clock signals ICLK1 to ICLK4 of FIG. 5, and the first to fourth transmission clock signals TCLK1 to TCLK4 may correspond to the first to fourth phase clock signals OCLK1 to OCLK4 of FIG. 5.

While various embodiments have been described above, it will be understood to those skilled in the art that the embodiments described are examples only. Accordingly, the signal generation circuit and method and the semiconductor apparatus, which have been described herein, should not be limited based on the described embodiments.

What is claimed is:

1. A signal generation circuit comprising:
   a first delay circuit configured to delay a first input signal based on a first delay control signal to generate a first output signal;
   a second delay circuit configured to delay a second input signal based on a second delay control signal to generate a second output signal;
   a phase detector configured to compare the phases of the first and second output signals to generate a phase detection signal; and
   a delay control circuit configured to change the value of only the second delay control signal based on the phase detection signal, and then decrease the values of the first and second delay control signals by the same value.

2. The signal generation circuit according to claim 1, wherein the delay control circuit decreases the logic values of the first and second delay control signals until any one of the first and second delay control signals has a minimum value.

3. The signal generation circuit according to claim 1, wherein the delay control circuit comprises:
   a first locking detector configured to generate a first phase locking signal based on the phase detection signal;
   a second locking detector configured to generate a second phase locking signal when any one of the first and second delay control signals has a minimum value; and
   a delay control signal generation circuit configured to change logic values of the first and second delay control signals based on the phase detection signal, the first phase locking signal, and the second phase locking signal.

4. The signal generation circuit according to claim 3, wherein the first locking detector enables the first locking signal when a previously received phase detection signal has a first logic level and a currently received phase detection signal has a second logic level.

5. The signal generation circuit according to claim 3, wherein the second locking detector enables the second locking signal based on the logic levels of the least significant bits of the first and second delay control signals.

6. The signal generation circuit according to claim 3, wherein the delay control signal generation circuit changes the logic value of the second delay control signal based on the phase detection signal until the first locking signal is enabled, and sequentially decreases the logic values of the first and second delay control signals until the second locking signal is enabled, when the first locking signal is enabled.

7. A signal generation method comprising:
generating, by a first delay circuit and a second delay circuit, a first output signal and a second output signal by delaying a first input signal and a second input signal by a first time, respectively;
comparing, by a phase detector, the phases of the first and second output signals; and
changing, by a delay control circuit, a delay time of only the second input signal to a second time and then decreasing the first and second times by the same amount of time.

8. The signal generation method according to claim 7, wherein the same amount of time corresponds to the shorter time between the first and second times.

9. A signal generation circuit comprising:
a first delay circuit configured to delay a first input signal to generate a first output signal;
a second delay circuit configured to delay a second input signal to generate a second output signal; and
a duty control circuit configured to change a delay time of only the second delay circuit until a phase difference between the first and second output signals reaches a target value, and then decrease the delay times of the first and second delay circuits by the same time.

10. The signal generation circuit according to claim 9, wherein the duty control circuit decreases the delay times of the first and second delay circuits by the shorter delay time between the delay times of the first and second delay circuits.

11. The signal generation circuit according to claim 9, wherein the first delay circuit delays the first input signal based on a first delay control signal, and
the second delay circuit delays the second input signal based on a second delay control signal.

12. The signal generation circuit according to claim 11, wherein the duty control circuit compares the phases of the first and second output signals and changes the value of the second delay control signal, and then decreases the values of the first and second delay control signals by the same value.

13. The signal generation circuit according to claim 11, wherein the duty control circuit comprises:
a phase detector configured to compare the phases of the first and second output signals to generate a phase detection signal; and
a delay control circuit configured to change the logic value of the second delay control signal based on the phase detection signal, and then decrease the logic values of the first and second delay control signals by the same value.

14. The signal generation circuit according to claim 13, wherein the delay control circuit comprises:
a first locking detector configured to generate a first phase locking signal based on the phase detection signal;
a second locking detector configured to generate a second phase locking signal when any one of the first and second delay control signals has a minimum value; and
a delay control signal generation circuit configured to change the logic values of the first and second delay control signals based on the phase detection signal, the first phase locking signal, and the second phase locking signal.

15. The signal generation circuit according to claim 14, wherein the first locking detector enables the first locking signal when a previously received phase detection signal has a first logic level and a currently received phase detection signal has a second logic level.

16. The signal generation circuit according to claim 14, wherein the second locking detector enables the second locking signal based on the logic levels of the least significant bits of the first and second delay control signals.

17. The signal generation circuit according to claim 14, wherein the delay control signal generation circuit changes the logic value of the second delay control signal based on the phase detection signal until the first locking signal is enabled, and sequentially decreases the logic values of the first and second delay control signals until the second locking signal is enabled, when the first locking signal is enabled.

18. A signal generation circuit comprising:
a first delay circuit configured to delay a first input clock signal by a reference delay time to generate a first phase clock signal;
a second delay circuit configured to delay a second input clock signal by a first variable delay time to generate a second phase clock signal;
a third delay circuit configured to delay a third input clock signal by a second variable delay time to generate a third phase clock signal;
a fourth delay circuit configured to delay a fourth input clock signal by a third variable delay time to generate a fourth phase clock signal; and
a duty control circuit configured to change the first to third variable delay times based on phase differences among the first to fourth phase clock signals, and then to decrease the reference delay time and the first to third variable delay times by the same time.

19. The signal generation circuit according to claim 18, wherein the duty control circuit decreases the reference delay time and the first to third variable delay times by the shortest time among the reference delay time and the first to third variable delay times.

20. The signal generation circuit according to claim 18, wherein the first delay circuit delays the first input signal based on a first delay control signal,
the second delay circuit delays the second input signal based on a second delay control signal,
the third delay circuit delays the third input signal based on a third delay control signal, and
the fourth delay circuit delays the fourth input signal based on a fourth delay control signal.

21. The signal generating circuit according to claim 20, wherein the duty control circuit compares the phases of the first to fourth phase clock signals and changes the values of the second to fourth delay control signals, and then decreases the values of the first to fourth delay control signals by the same value.

22. The signal generation circuit according to claim 21, wherein the duty control circuit decreases the values of the first to fourth delay control signals by the value of the delay control signal having the smallest value among the first to fourth delay control signals.

23. The signal generation circuit according to claim 20, wherein the duty control circuit comprises:
a phase detector configured to detect phase differences among the first to fourth phase clock signals, and generate a first phase detection signal, a second phase detection signal, and a third phase detection signal; and a delay control circuit configured to change the logic values of the second to fourth delay control signals based on the first to third phase detection signals, and change the logic values of the first to fourth delay control signals by the same value.

24. The signal generation circuit according to claim 23, wherein the delay control circuit comprises:

a first phase locking detector configured to generate a first phase locking signal based on the first to third phase detection signals;

a second phase locking detector configured to generate a second phase locking signal when any one of the logic values of the first to fourth delay control signals has a minimum value; and a delay control signal generation circuit configured to change the logic values of the first to fourth delay control signals based on the first phase detection signal, the second phase detection signal, the third phase detection signal, the first phase locking signal, and the second phase locking signal.

25. The signal generation circuit according to claim 24, wherein the first phase locking detector comprises:

a first locking detector configured to generate a first locking signal based on the logic level of the first phase detection signal;

a second locking detector configured to generate a second locking signal based on the logic level of the second phase detection signal;

a third locking detector configured to generate a third locking signal based on the logic level of the third phase detection signal; and a gating circuit configured to enable the first phase locking signal when the first to third locking signals are all enabled.

26. The signal generation circuit according to claim 24, wherein the second phase locking detector enables the second phase locking signal based on the logic levels of the least significant bits of the first to fourth delay control signals.

27. The signal generation circuit according to claim 24, wherein the delay control signal generation circuit changes the logic values of the second to fourth delay control signals based on the first to third phase detection signals, until the first phase locking signal is enabled, and sequentially decreases the logic values of the first to fourth delay control signals when the second phase locking signal is enabled.

* * * * *